US012540401B2

(12) United States Patent
Guo

(10) Patent No.: US 12,540,401 B2
(45) Date of Patent: Feb. 3, 2026

(54) LARGE CAPACITY DEPOSITION SYSTEM

(71) Applicant: Ascentool, Inc., Palo Alto, CA (US)

(72) Inventor: George Xinsheng Guo, Palo Alto, CA (US)

(73) Assignee: Ascentool, Inc., Palo Alto, CA (US)

( * ) Notice: Subject to any disclaimer, the term of this patent is extended or adjusted under 35 U.S.C. 154(b) by 189 days.

(21) Appl. No.: 18/357,402

(22) Filed: Jul. 24, 2023

(65) Prior Publication Data

US 2024/0026543 A1 Jan. 25, 2024

Related U.S. Application Data

(60) Provisional application No. 63/369,364, filed on Jul. 25, 2022.

(51) Int. Cl.

| | |
|---|---|
| ***C23C 16/458*** | (2006.01) |
| ***C23C 16/452*** | (2006.01) |
| ***C23C 16/455*** | (2006.01) |
| ***C23C 16/46*** | (2006.01) |
| ***C23C 16/54*** | (2006.01) |

(52) U.S. Cl.

CPC ............ *C23C 16/54* (2013.01); *C23C 16/452* (2013.01); *C23C 16/45559* (2013.01); *C23C 16/458* (2013.01); *C23C 16/4587* (2013.01); *C23C 16/46* (2013.01)

(58) Field of Classification Search

None

See application file for complete search history.

(56) References Cited

U.S. PATENT DOCUMENTS

| | | | | |
|---|---|---|---|---|
| 5,433,835 | A | 7/1995 | Demaray | |
| 5,814,196 | A | 9/1998 | Hollars | |
| 2005/0186338 | A1* | 8/2005 | Roscheisen | C25D 7/0614 427/248.1 |
| 2007/0045108 | A1 | 3/2007 | Demaray | |
| 2008/0152803 | A1* | 6/2008 | Lamouroux | C23C 16/4587 118/724 |

* cited by examiner

*Primary Examiner* — Jason Berman

(74) *Attorney, Agent, or Firm* — SV Patent Service

(57) ABSTRACT

A plasma deposition apparatus includes a vacuum chamber, and a workpiece assembly that includes a frame that can hold a plurality of workpieces, and gas channels formed in between the workpieces and the frames. The gas channels can transport gas from a gas source to the plurality of workpieces to produce material deposition on the workpieces. The workpiece assembly can form a cylinder in the vacuum chamber.

20 Claims, 28 Drawing Sheets

LARGE CAPACITY DEPOSITION SYSTEM

BACKGROUND OF THE INVENTION

The present application relates to material deposition technologies, and more specifically to high throughput and high-capacity chemical vapor deposition (CVD), or plasma enhanced CVD apparatus.

Vacuum depositions such as sputtering, evaporation, sublimation, chemical vapor deposition (CVD), or plasma enhanced chemical vapor deposition (PECVD) are used in many industries to deposit materials on workpieces such as web, glass, semiconductor wafers, hard disks, et al.

PECVD is often applied between parallel plates to achieve good uniformity. One challenge for parallel-plate PECVD is the relative low plasma density and low densities of reactive species, which require relatively high process pressures to maintain stable plasma. The higher process pressure leads to low ionization efficiency and high rate of reactions in gas phase, resulting in low material utilization, powder formation and expensive waste gas treatment system. Another challenge for PECVD is deposition on the plasma sources, which can lead to particulate formation, clogging of gas distribution holes, and changes in plasma conditions. The in-situ cleaning of the plasma sources is not only time consuming but also impractical for some applications such as roll-to-roll web processing where the workpieces are always present.

Multiple parallel plates with alternate cathode and anode placement are used to generate plasma between plates. This approach increases the area of work pieces, avoids separate deposition sources, and increases the precursor utilization rate on work pieces. FIG. 1A shows a conventional deposition system 100 in this arrangement with work pieces 110 mounted inside rigid frames 115 of interlaced electrodes 116 and counter electrodes 117, which are separated by insulating stands 118. The electrodes 116 and the counter electrodes 117 are connected to electrical connectors 119. FIG. 1B shows a conventional deposition system 150 having a stack of multiple parallel plates of electrodes 155 and counter electrodes 156 forming plasma 160 during operation. The electrodes 155 and the counter electrodes 156 are separated by insulating stands 157.

There are many issues with the conventional deposition systems 100, 150: the plasma intensity and deposition rate is higher between edges of the plates caused by the sharper radius of the edges; there is no uniform gas distribution inside the stack as precursor gases flow from one end of stack to the other end; the workpieces inside the stack can deform under heat or under plasma power, especially if the workpieces are foils mounted on frames. The deformation of workpieces changes the gap between electrodes and leads to non-uniformity or electrical shorts.

There is therefore a need for PECVD systems with high workpiece loading capacity, high gas utilization, reduced gas phase reactions and powder formations, reduced or eliminated deposition on deposition sources and chambers, compatible with deposition of multiple materials or using multiple deposition technologies, and increased system productivity.

SUMMARY OF THE INVENTION

The present application discloses a high loading capacity deposition system for CVD and PECVD. Comparing to conventional systems, the disclosed system have higher loading capacity, fewer sharper edges, higher gas utilization, reduced gas phase reactions and powder formations, reduced or eliminated deposition on deposition sources, more uniform gas distribution and deposition uniformity, reduced or eliminated deformation of work pieces, reduced deformation of workpieces, easier loading and unloading of work pieces, easier cleaning of the deposition system, and minimized process condition variation throughout equipment lifetime.

In one general aspect, the present invention relates to a plasma deposition apparatus includes a vacuum chamber, and a first workpiece assembly that includes a first frame that can hold a plurality of workpieces, and first gas channels formed in between the workpieces and the frames. The first gas channels can transport a gas from a gas source to the plurality of workpieces to produce material deposition on the workpieces. The first workpiece assembly can form a first cylinder in the vacuum chamber.

Implementations of the system may include one or more of the following. The plasma deposition apparatus can further include a plurality of workpiece assemblies including the first workpiece assembly, wherein the plurality of workpiece assemblies can form concentric cylinders in the vacuum chamber. Each of the plurality of workpiece assemblies can include a frame configured to hold a plurality of workpieces, gas channels formed in between the workpieces and the frames, wherein the gas channels can transport a gas from a gas source to the plurality of workpieces, wherein the workpiece assembly can form one of the concentric cylinders in the vacuum chamber. The plasma deposition apparatus can further include a power supply configured to produce an electric potential between adjacent workpiece assemblies in the concentric cylinders. The plasma deposition apparatus can further include a magnetic ring disposed adjacent to the first workpiece assembly, wherein the magnetic ring is configured to produce a magnetic field that increases plasma ionization of the gas. The first frame can include gas distribution plates configured to hold a plurality of workpieces, wherein the gas distribution plates are configured to define, in part, the gas channels, wherein the gas distribution plates include distribution holes configured to release the gas to vicinity of the workpieces. The plasma deposition apparatus can further include a magnet ring disposed adjacent to the first workpiece assembly and configured to produce a magnetic field next to surfaces of the workpieces to improve formation of the material deposition on the workpieces. The magnet ring can be formed by electrical magnets. The magnet ring can be formed by electrical coils. The magnet ring can be moved along an axial direction of the first cylinder to improve uniformity of the plasma and the material deposition. The plasma deposition apparatus can further include electric heaters configured to heat the workpieces. The first workpiece assembly can include a bottom portion and weights mounted to the bottom portion, wherein the weights are configured to produce tension in the first workpiece assembly. The plasma deposition apparatus of claim 1, wherein the first workpiece assembly comprises a bottom portion and springs mounted to the bottom portion, wherein the springs are configured to produce tension in the first workpiece assembly.

In another general aspect, the present invention relates to a plasma deposition apparatus that includes a vacuum chamber and a plurality of workpiece assemblies that form concentric cylinders in the vacuum chamber, wherein each of the plurality of workpiece assemblies can include a frame configured to hold a plurality of workpieces, wherein the plurality of workpieces can receive material deposition.

In another general aspect, the present invention relates to a plasma deposition apparatus that include a vacuum chamber, a plurality of webs that form a cylinder in the vacuum chamber, and transport mechanisms that can move each of the plurality of webs such that different portions of the plurality of webs can receive material deposition.

These and other aspects, their implementations and other features are described in detail in the drawings, the description, and the claims.

DETAILED DESCRIPTION OF THE INVENTION

Figure 1A:
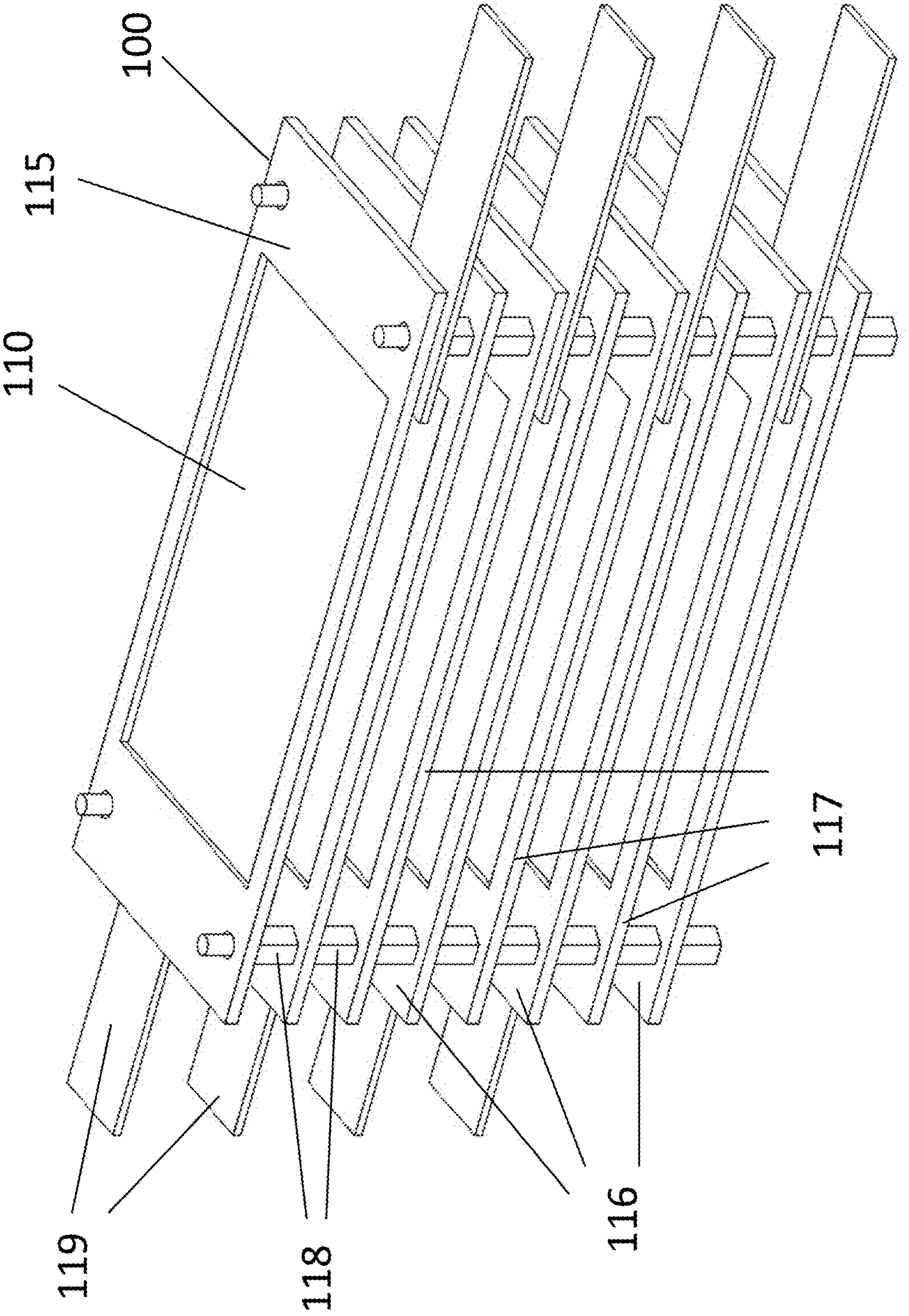
Figure 1A (Prior Art)
FIG. 1A shows a conventional deposition system including stacked parallel plates PECVD setup in accordance with the present invention.
Figure 1B:
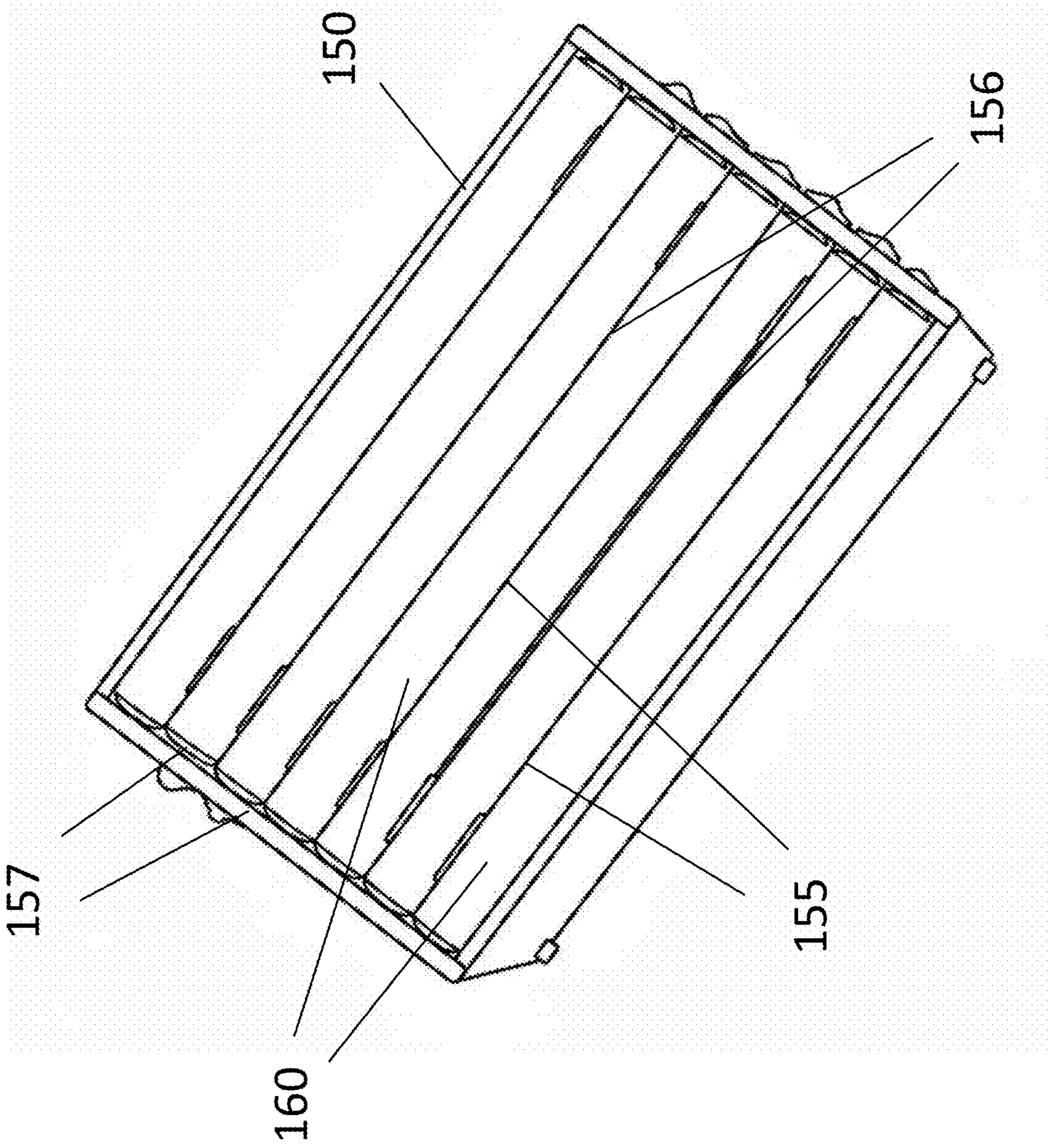
Figure 1B (Prior Art)
FIG. 1B is a photograph of the conventional deposition system in FIG. 1A in operation.

FIGS. 1A and 1B show a prior art stack of alternate cathodes and anodes and the resulting plasma in operation, the plasma intensity and deposition rate is higher between edges of the plates caused by the sharper radius of edges; there is no plasma nor deposition at outer surfaces of the stack; there is no uniform gas distribution inside the stack as precursor gases flow from one end of stack to the other end; the workpieces inside the stack can deform under heat or under plasma power, especially if the workpieces are foils mounted on frames as shown in FIG. 1A. We expect these effects will get worse for larger and longer work pieces.

Figure 2A:
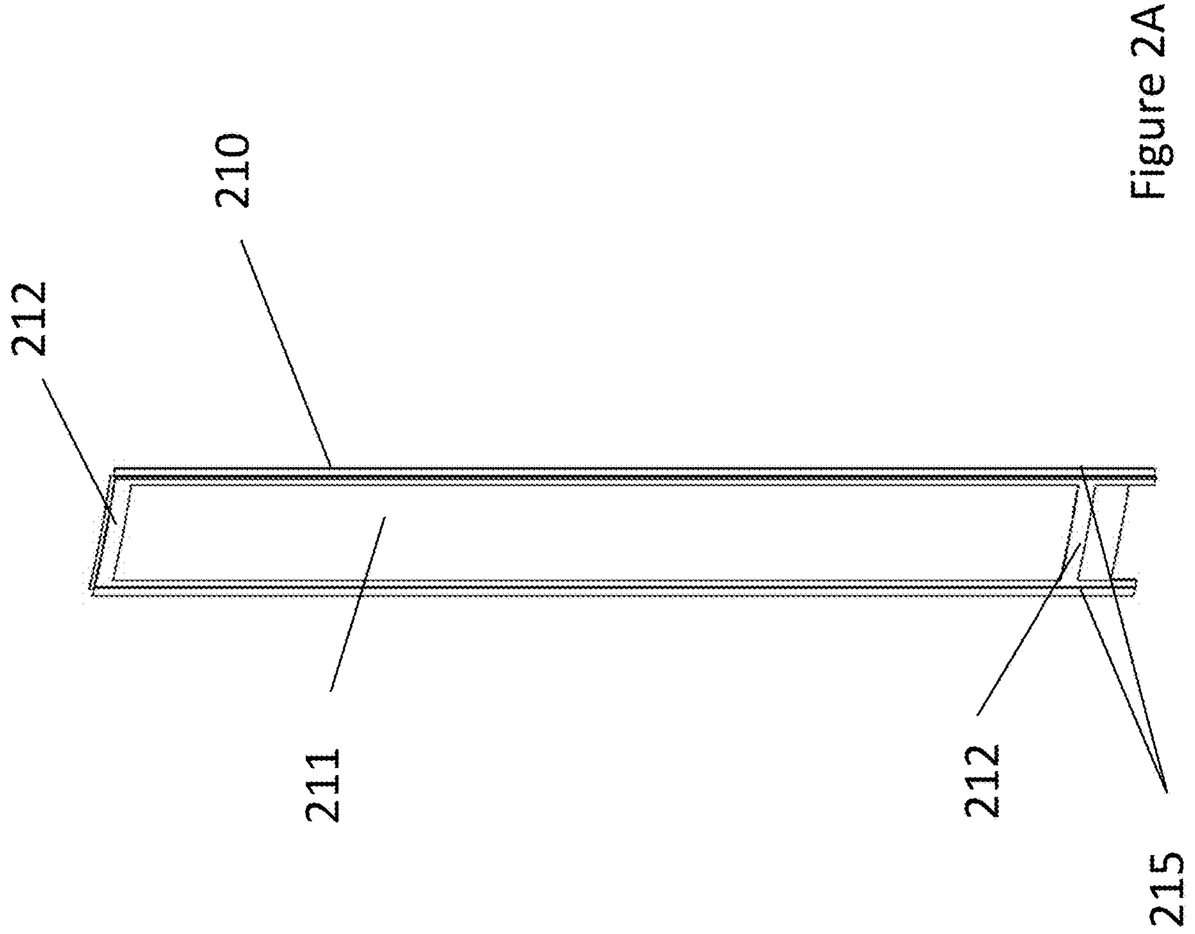
FIGS. 2A and 2B are a workpiece assembly and its lower part in detail, respectively, in accordance with the present invention.
Figure 2B:
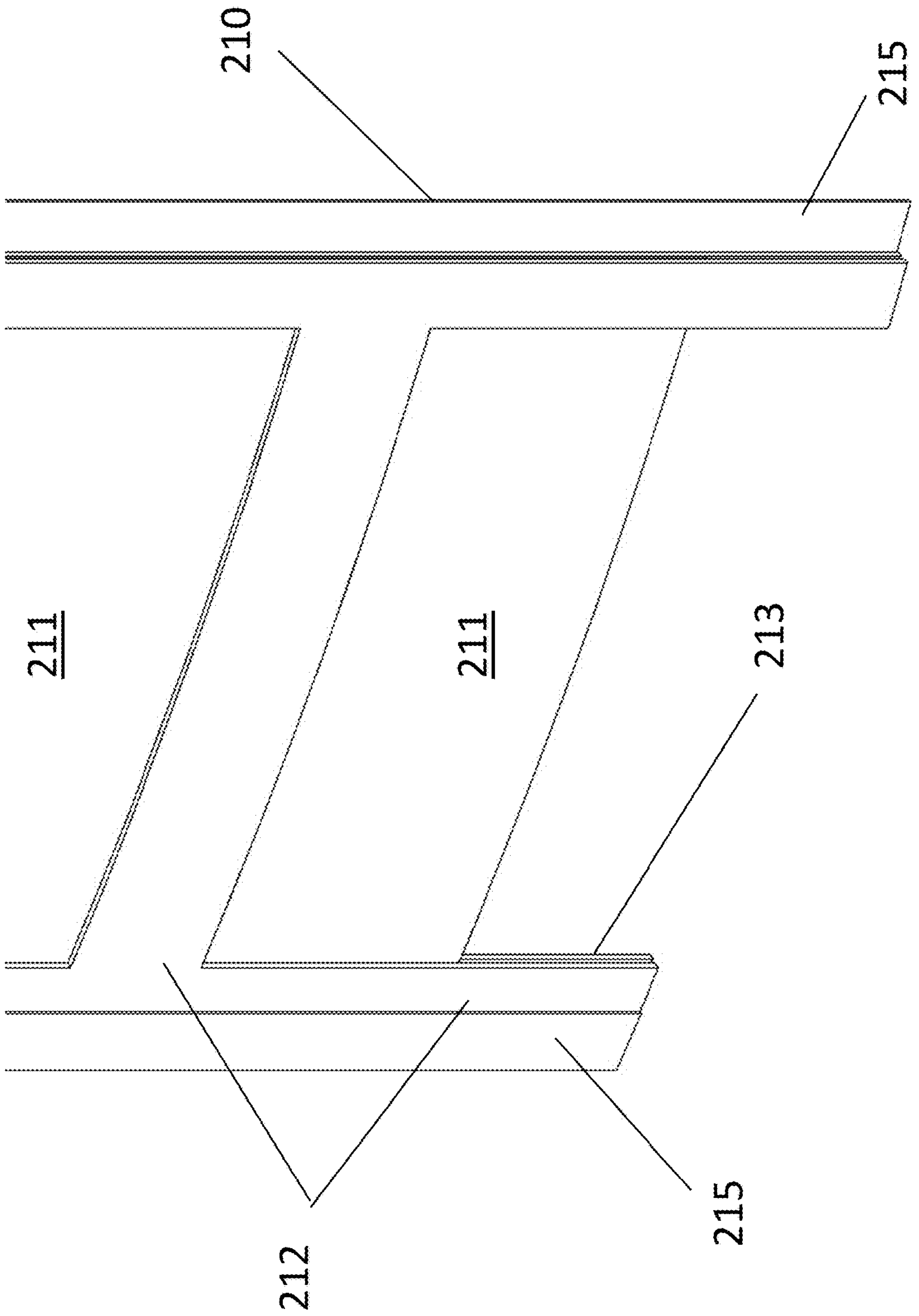
Figure 2C:
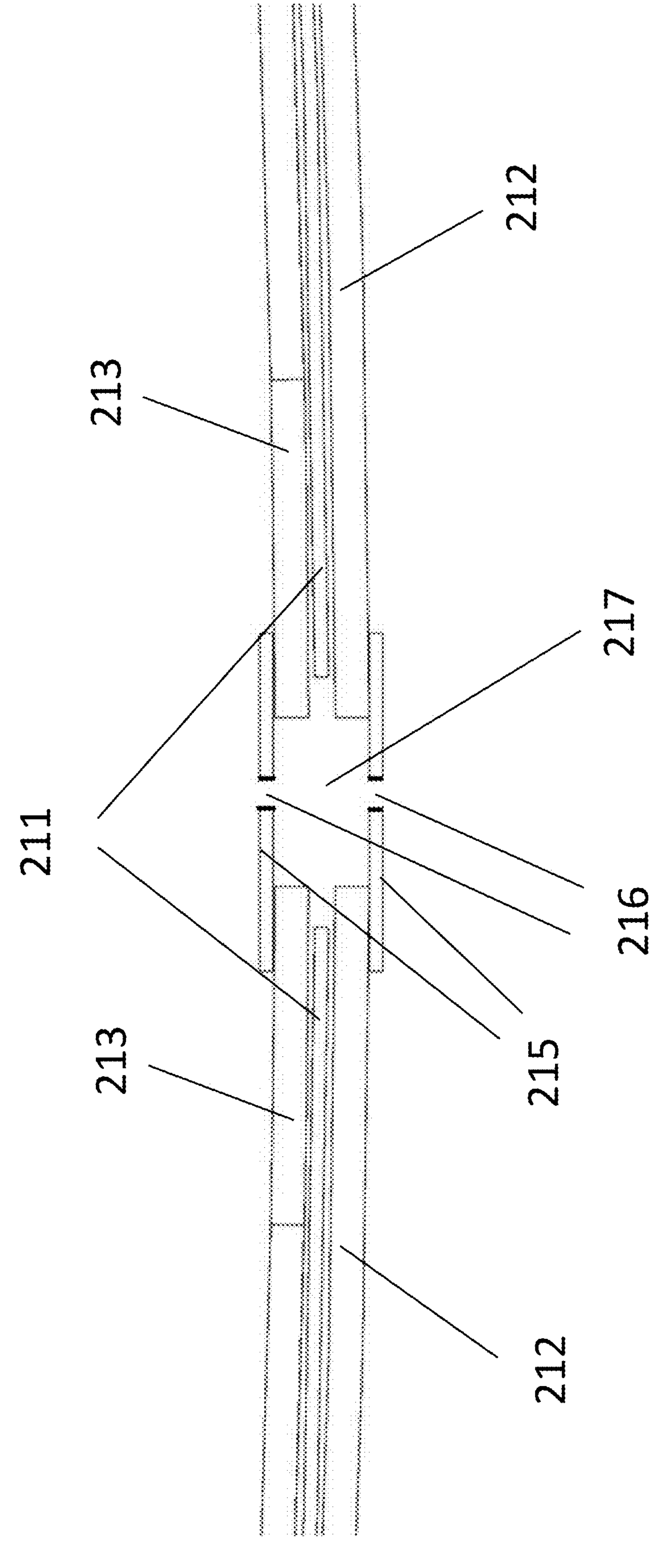
FIG. 2C is a top view of two workpiece assemblies forming a gas distribution channel in accordance with the present invention.
Figure 2D:
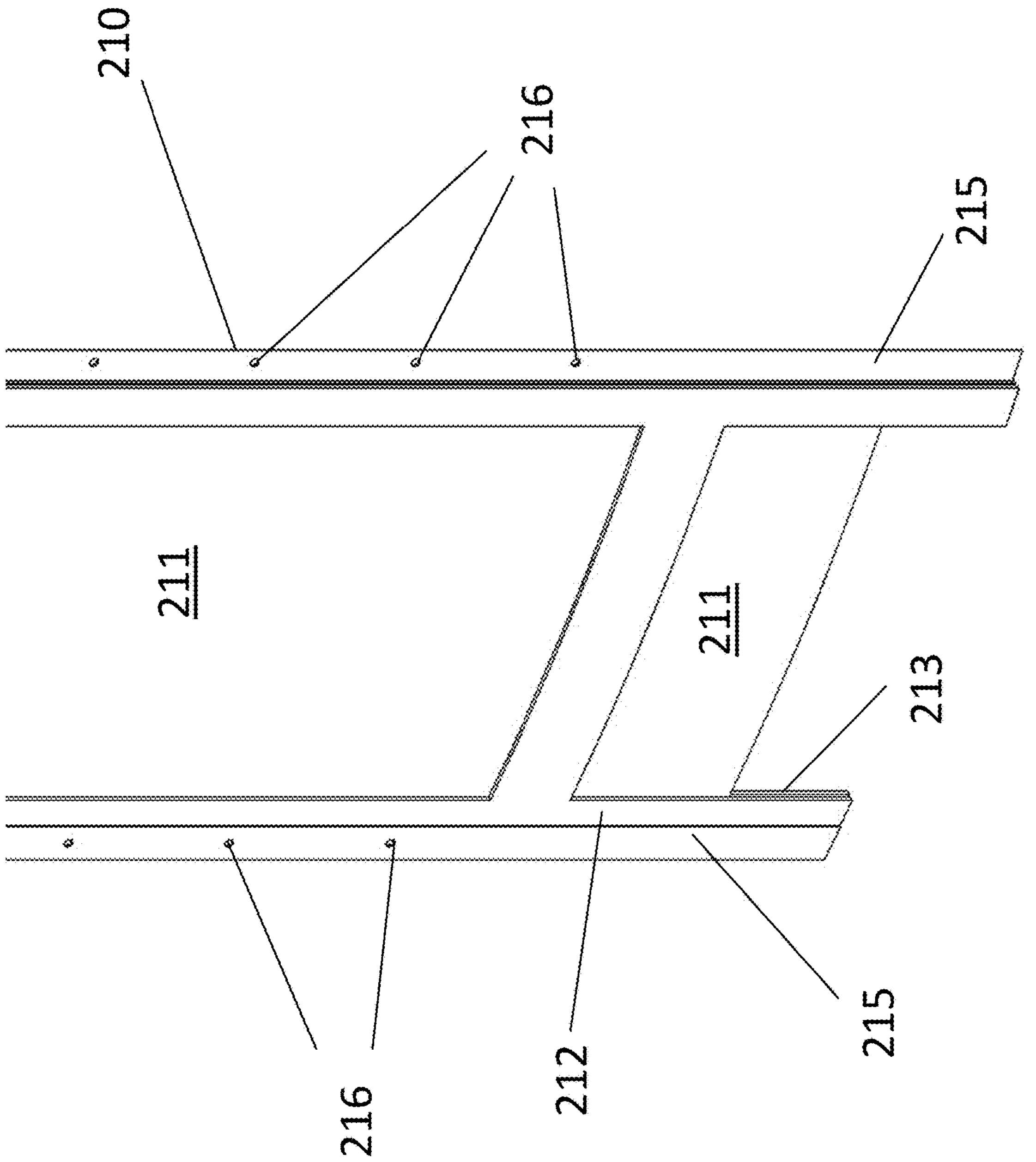
FIG. 2D shows a workpiece assembly having gas distribution holes in in accordance with the present invention.
Figure 2E:
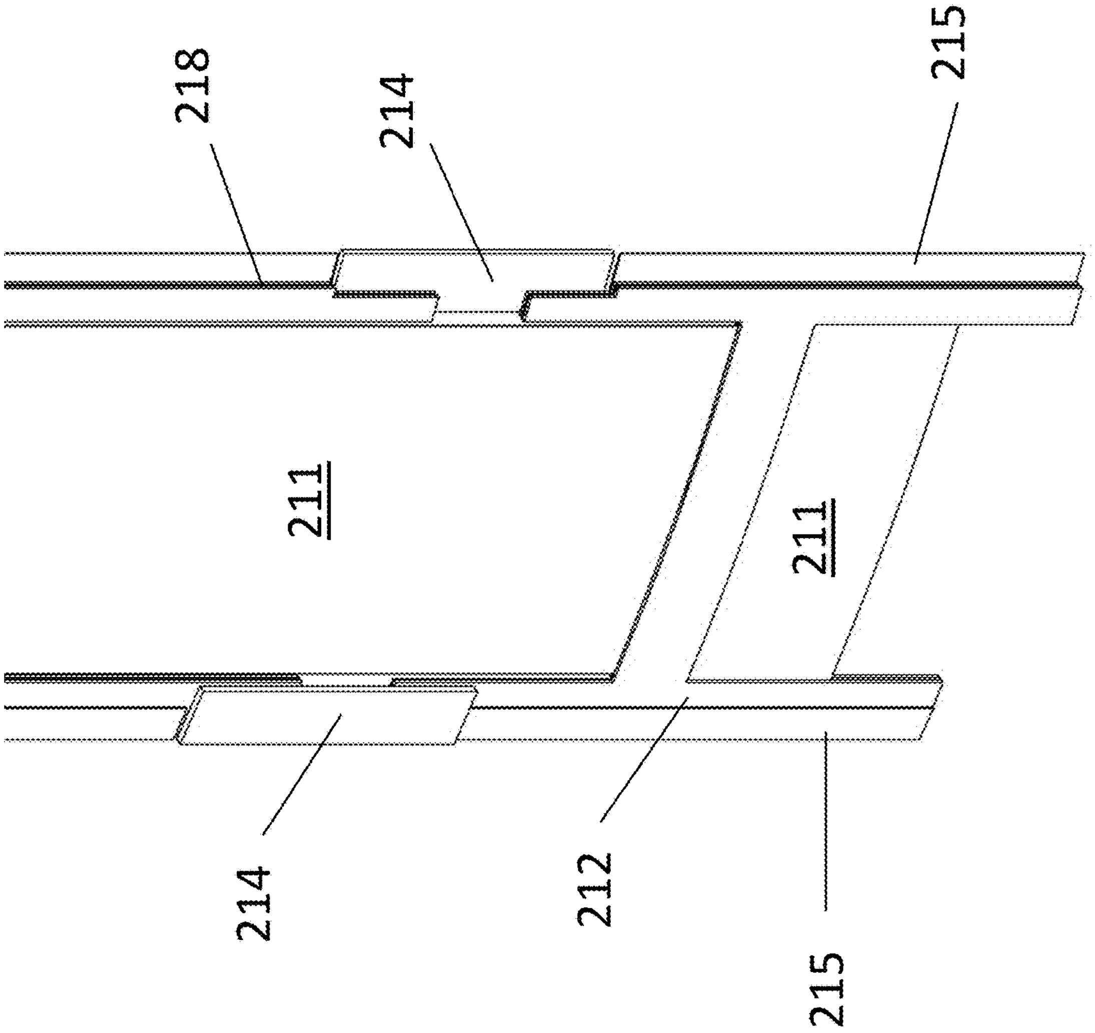
FIG. 2E shows electrical insulation in part of the workpiece assembly for electrical heating of the workpiece in accordance with the present invention.

FIGS. 2A and 2B show workpiece assembly 210 consisting of workpiece 211 in the shape of flexible foil or web, sandwiched between two frames 212 and 213. The foil 211 can be clamped or attached on top of the frames 213 and 212 and can have portions of foil extrude below the frame. The frame 213 and 212 can be flat or have the appropriate curvature to fit in circles where the workpiece assembly 210 is going to be mounted inside deposition chamber. We found an easy and fast way to mount the top of the workpiece is to bend the workpiece 211 over the edge of the frame 212 and 213 and clamp the workpiece to one or both frames using clamps or low-cost paper clips. The clamps also clamp frames together, if a two frame per workpiece mounting scheme is used. There is optional gas distribution plate 215 either as integrated part of the frame or attached or welded to the frame. The gas distribution plates from neighboring frames can form channels 217 for the precursor gas to pass through. The gas distribution holes 216 on the gas distribution plate 215 can distribute precursor gases evenly, as shown in FIGS. 2C and 2D. The top of the gas distribution channel 217 can have additional precursor gases coming in to improve uniformity, or to be blocked by the mounting connectors in FIGS. 3A-3E, or other means of blocking. There can be holes 216 drilled into the gas distribution plates 215 of FIG. 2B, as shown in FIG. 2D. The frames 212 and 213 can be made of metal or insulator, or sections of insulator 214 in the metal frame 212 to prevent electrical current from conducting through frame as shown in FIG. 2E. The work piece 211 can be mounted between top and bottom parts of the frame 212 and 213 and does not touch the side part of the frame, so that an electrical current can pass the workpiece and heat up the workpiece without heating up the frame as shown in FIG. 2E. Alternatively, there can be a single frame for each workpiece, where additional bars or plate may be needed to confine the work pieces to the single frame 212. When the work piece is mounted away from the frame 212 with a gap 218, an electrical current can pass through the work piece 211 and heat up the work piece 211. The frames and work pieces 211 in FIG. 2s can be replaced with work pieces by themselves without frame if the work pieces are rigid.

Figure 3A:
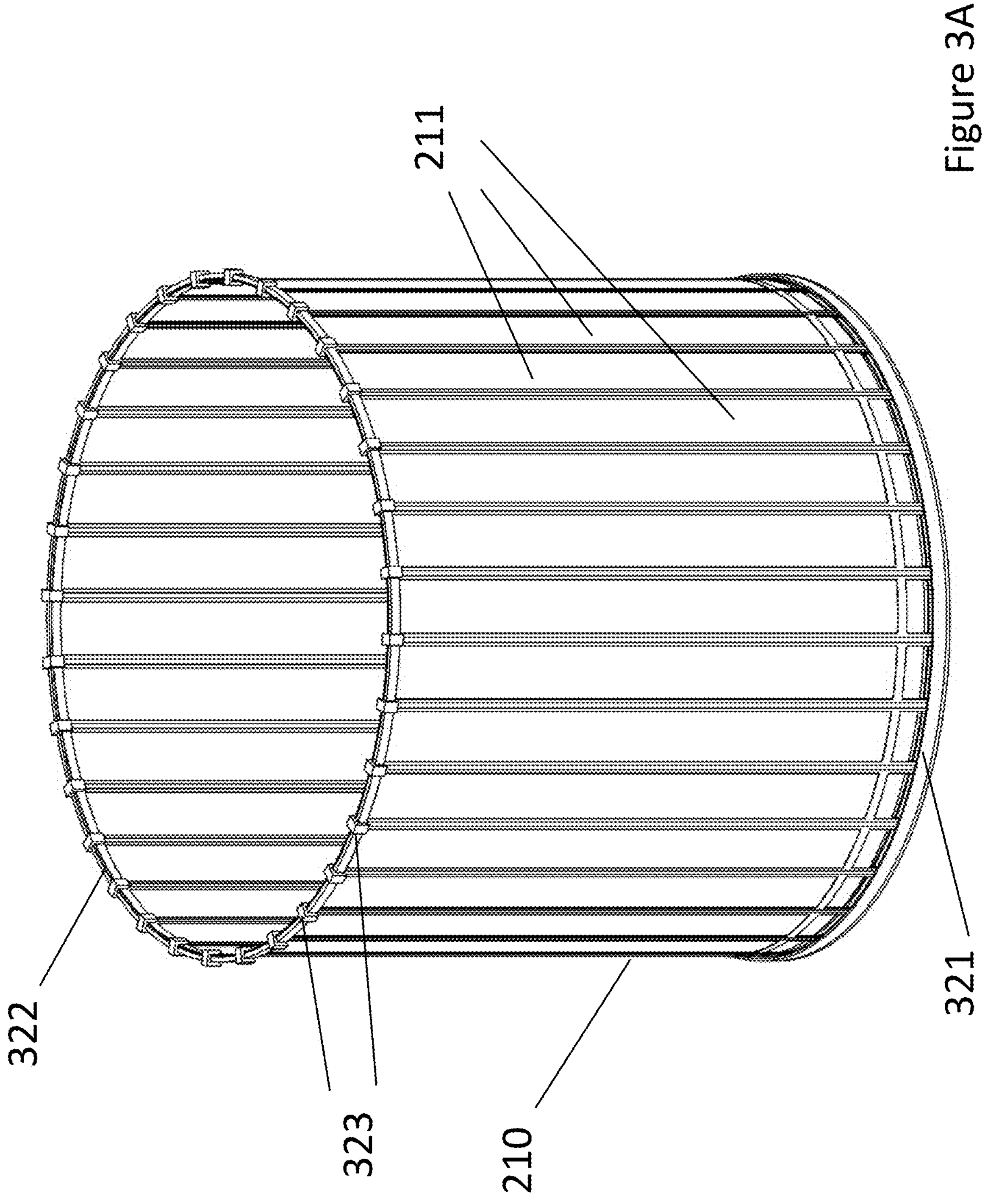
FIGS. 3A and 3B are perspective view and in sectional perspective view, respectively, showing individual workpiece assemblies forming a closed loop in accordance with the present invention.
Figure 3B:
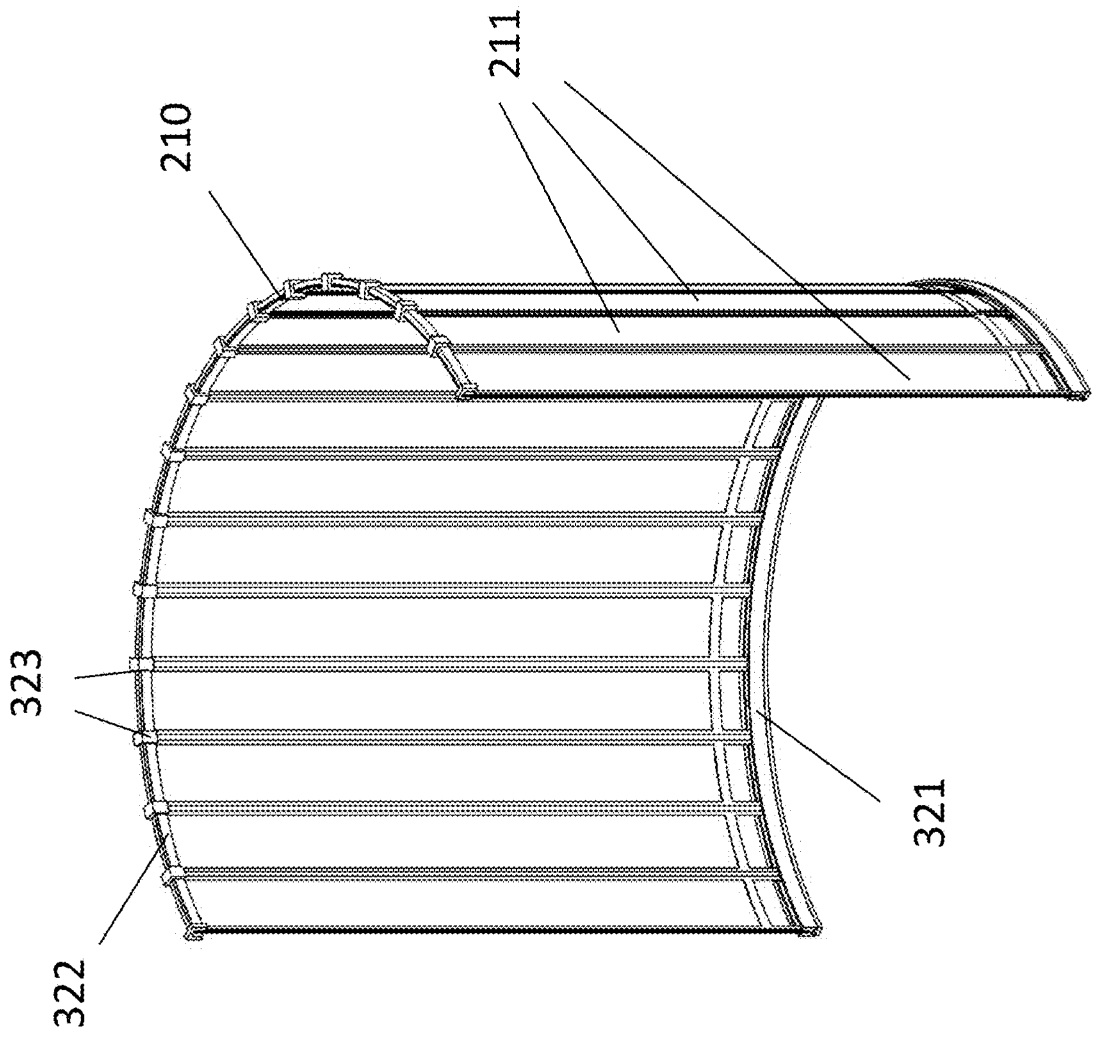
Figure 3C:
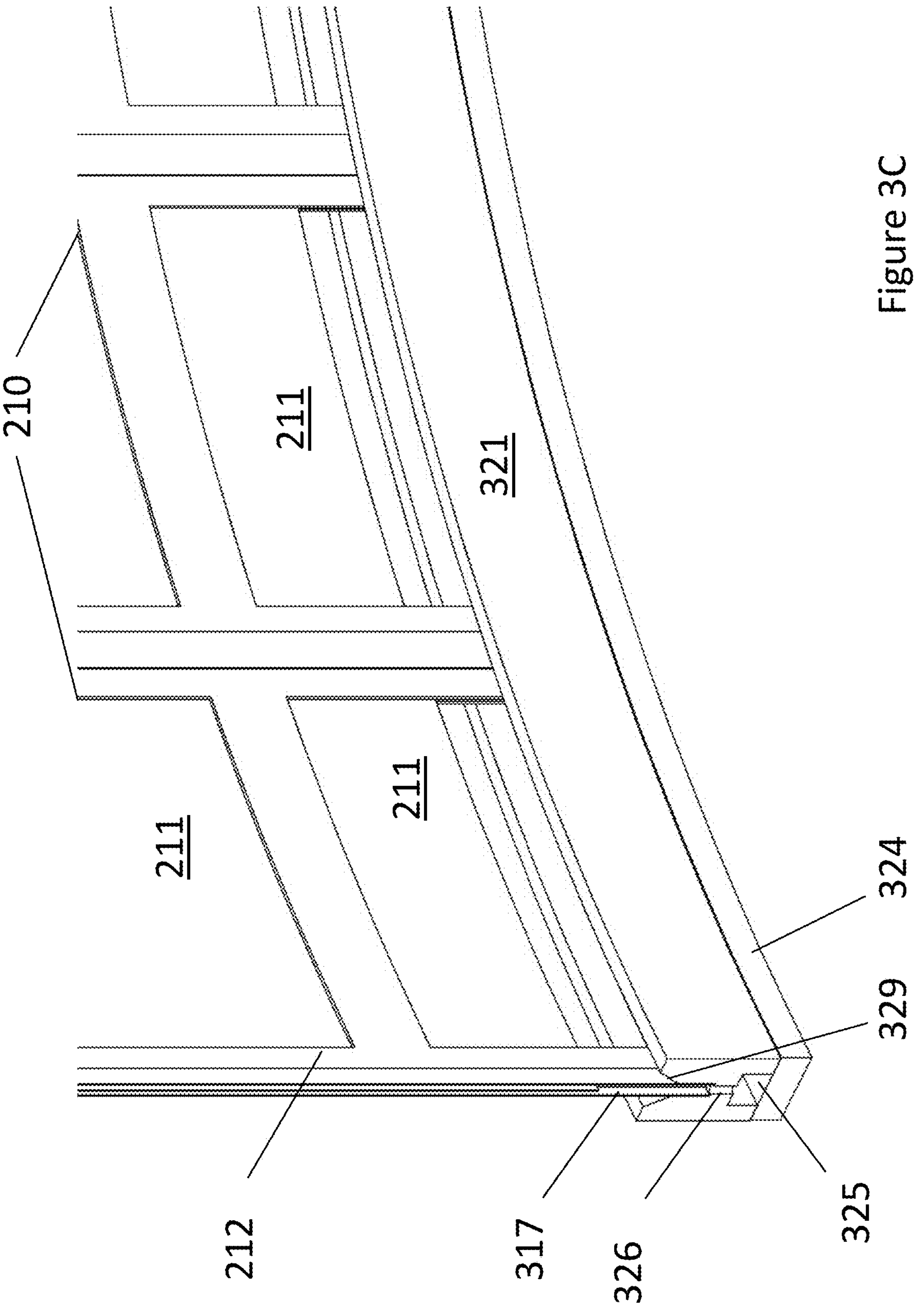
FIGS. 3C and 3D are lower detailed view and upper detailed view respectively, showing individual workpiece assemblies form a closed loop in accordance with the present invention.
Figure 3D:
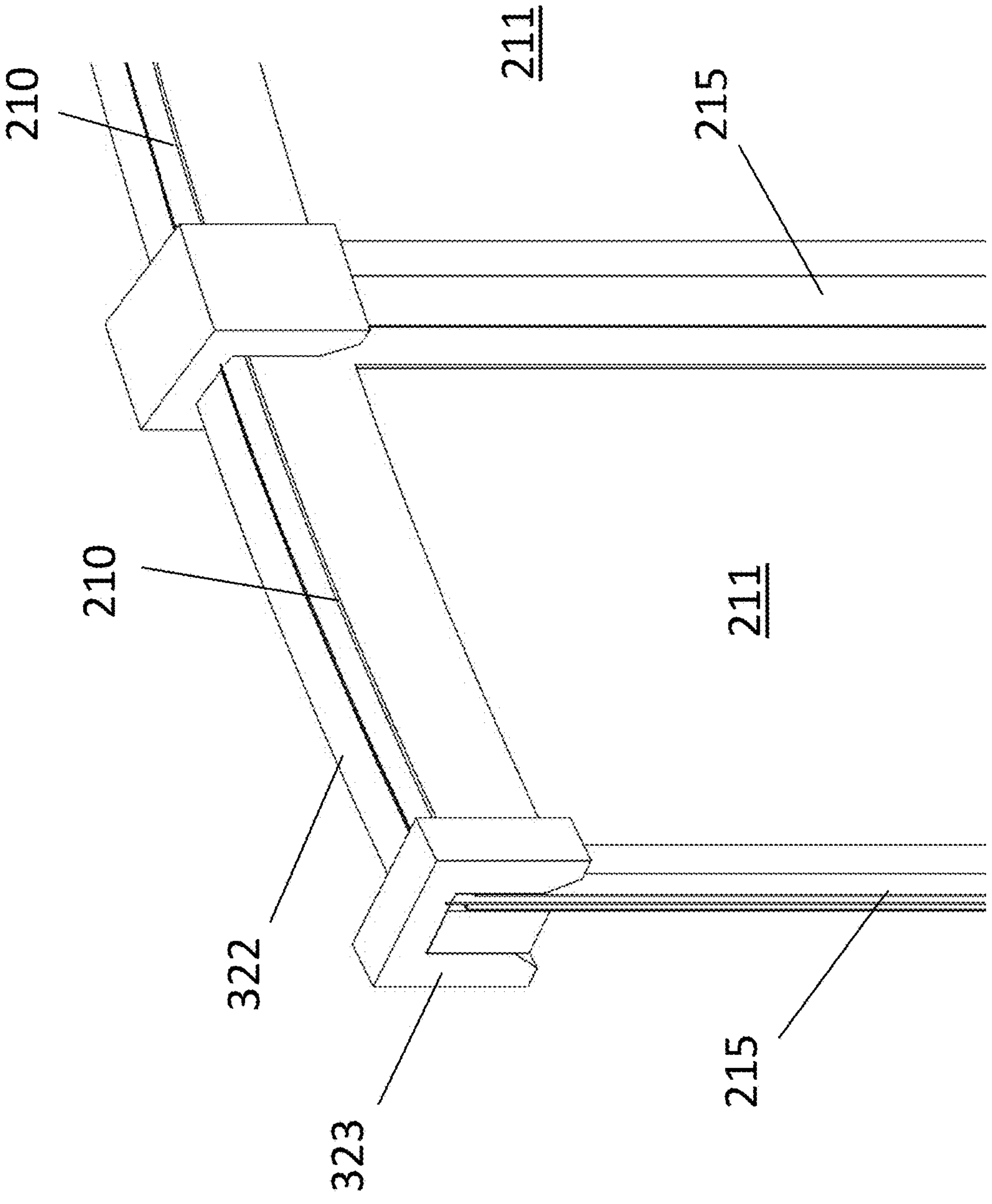

FIG. 3A shows individual workpiece assembly 210 mounted in a circle and FIG. 3B is the sectional view of FIG. 3A. The workpiece assembly 210 can be inserted into a groove 329 inside the lower mounting ring 321 where the workpiece assembly 210 electrically contact to one of the terminals of DC, AC, or RF power supply through the contactors within the groove or with the groove directly. There can be spring like electrical contacts commonly used to ensure good electrical connections. The electrical contacts also held workpiece assembly 210 in place as illustrated in FIG. 3C. There is a gas distribution channel 325 and gas distribution channel cover 324 under the lower mounting ring 321 and gas distributing holes 326 in the lower mounting ring 321. The workpiece assembly 210 can be lined up to have the gas channels 217 from FIG. 2C in the frame directly above the gas distribution holes 326 in the groove. The groove 329 holds the lower part of frame and can deform the frames slightly to fit in the groove, as shown in FIG. 3C. The upper part of the frames can be attached to an optional rigid upper ring 322 through connectors 323 as shown in FIG. 3D, or to be attached to other workpiece assemblies 210 through connectors 323.

Figure 4A:
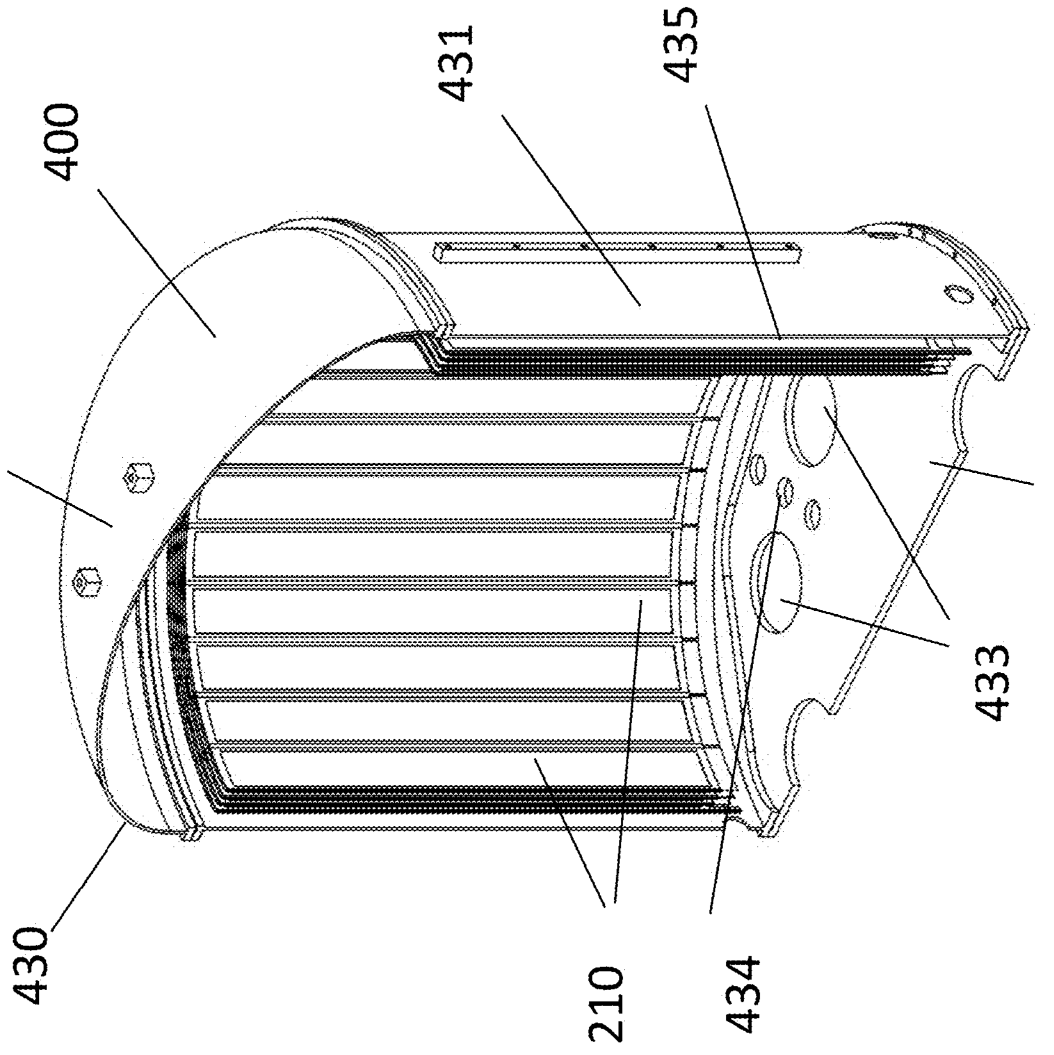
FIG. 4A is a sectional perspective view of a vacuum deposition system including individual workpiece assemblies forming multiple closed loops inside a process chamber in accordance with the present invention.
Figure 4B:
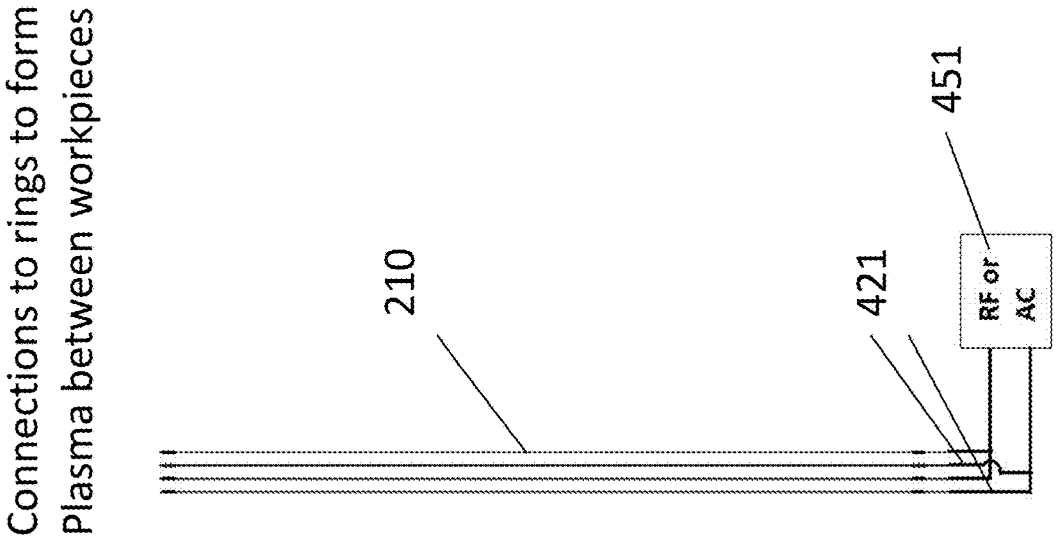
FIG. 4B shows the electrical connections between the multiple closed loops in the vacuum deposition system shown in FIG. 4A to form plasma in accordance with the present invention.
Figure 4C:
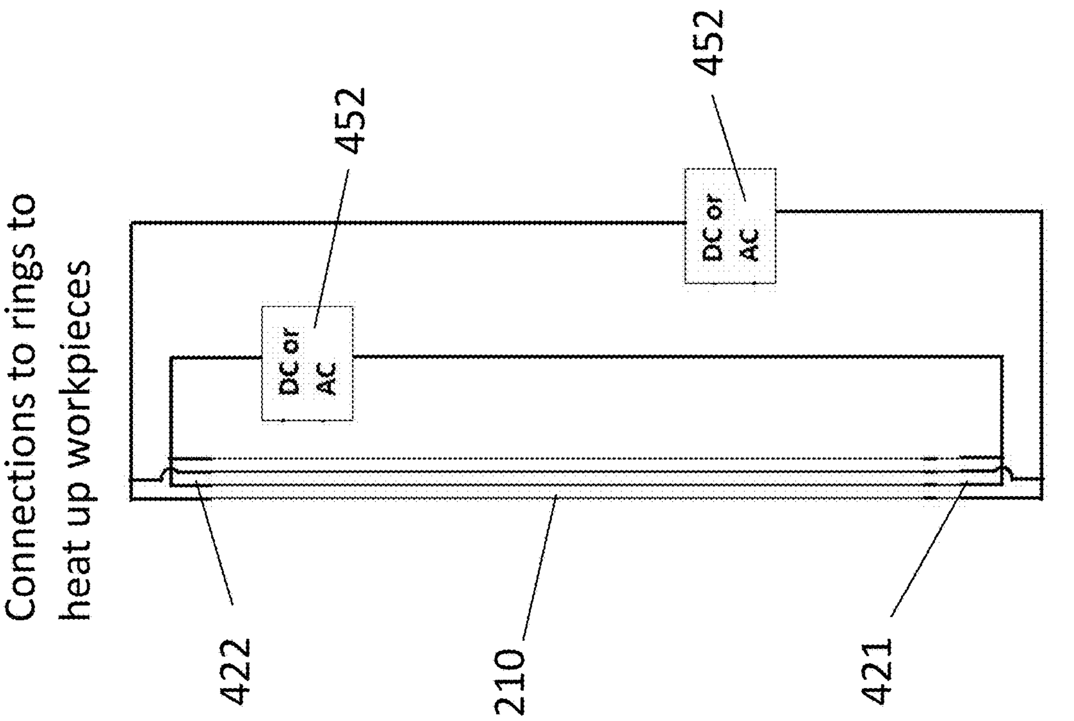
FIG. 4C shows the electrical connections between and within the multiple closed loops the vacuum deposition system shown in FIG. 4A to heat up workpieces in accordance with the present invention.

Multiple rings made of individual workpiece assembly 210 can be installed within a process chamber, as illustrated in FIG. 4A. Connectors 323 can also be made with precise spacing to clamp frames in different rings and can fix the distance between frames in different radius. These connectors 323 can be insulators or with conductors on top of insulators. There can be two different rigid rings with different electrical potentials to contact alternate frames and workpieces and serve as electrical connections for plasma formation or for heating, to ensure plasma between neighboring frames and workpieces without shorting as illustrated in FIGS. 4B and 4C. The various connectors can conduct electricity through the work pieces to heat them up as an option, or/and to connect opposite polarity to neighboring frames or/and workpieces to form plasma between neighboring frames.

Figure 3E:
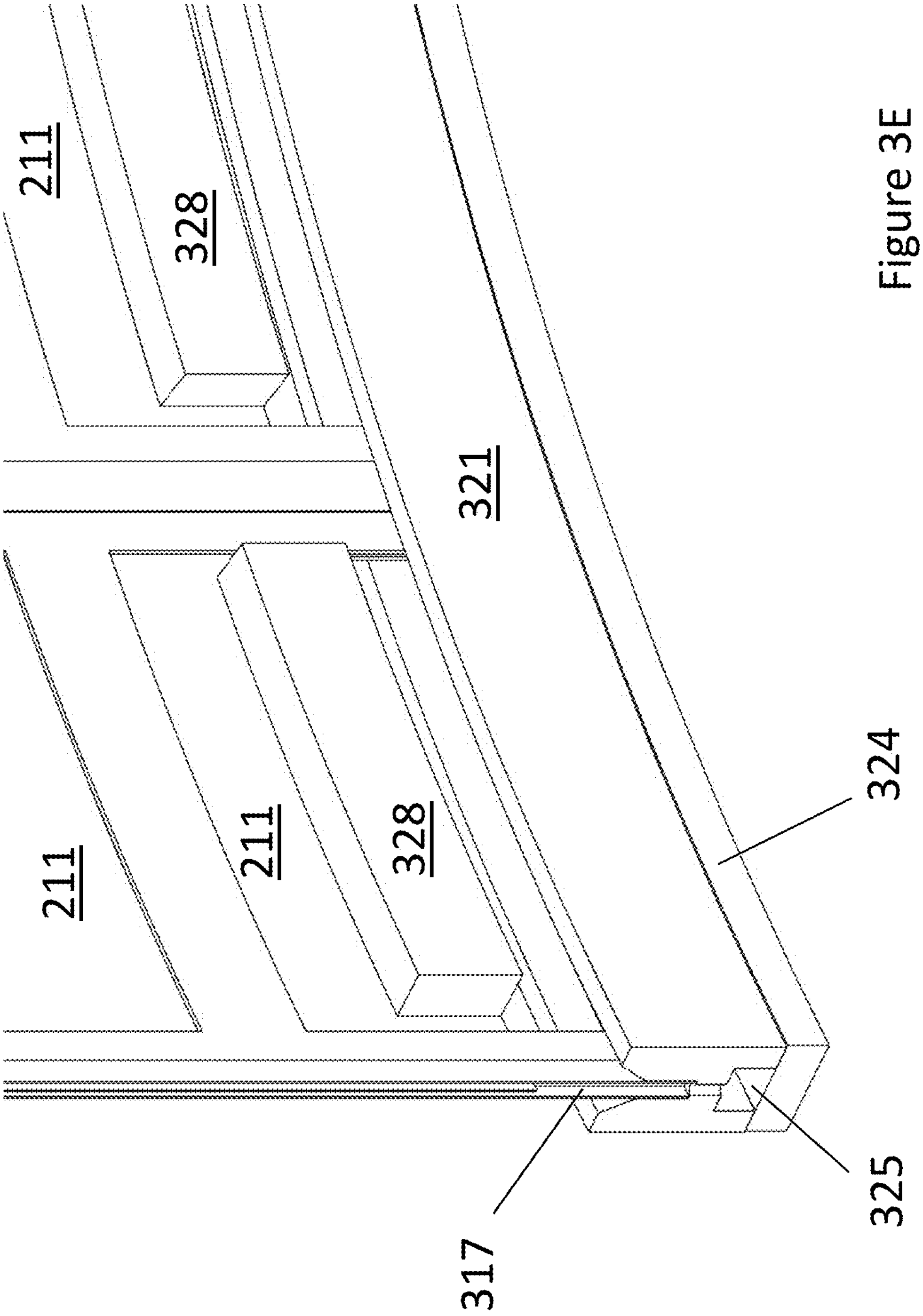
FIG. 3E shows the workpiece of FIG. 3C can be weighted down to apply tension in accordance with the present invention.

During CVD operation, a set voltage across the workpieces will heat up the workpieces, activate the precursor gases and form films (CVD). During PECVD, the workpieces can be heated up as an option, and then at least some of the connections are switched to AC or RF to induce PECVD. To prevent wrinkling or deformation of the work pieces during higher temperature processing, weights 328 can be attached to the lower part of the workpiece 211 and apply tension, as shown in FIG. 3E. The weight can be clamped, fastened, or attached in other ways. Springs can also be used to apply tension to the workpieces instead of weights.

In some embodiments, referring to FIG. 4A, a vacuum deposition system 400 includes multiple rings formed by workpiece assemblies 210 and workpieces with different radius in a vacuum chamber 430. The vacuum chamber 430 includes chamber wall 431, chamber cover 432, bottom plate 436 and optional chamber insulator 435. Details of the multiple rings formed by frames 210 and their mounting are shown in FIGS. 3A-3E. Neighboring rings can be connected to either positive or negative terminals of the power supply alternatively so that the frames with workpieces can form plasma between neighboring workpieces mounted at different radius in the process chamber. The process chamber can have many pumping ports 433 and other ports 434 for electrical, gas lines, or sensor connections. The electrical connections to form RF or AC plasma are shown in FIG. 4B. Alternate rings consisting of workpiece assemblies 210 are connected to either the positive or negative terminals of power supply 451 through connectors 421 and form cathodes or anodes of the plasma. Separate power control can be used for different rings with their RF or AC frequency in synchronization to form power supply 451. Multiple rings can also be connected to the same power supply 451 to save cost.

The frame 210 can also be connected to two separate terminals between the top and the bottom of the frames 422 and 421 respectively; so that each frame and workpiece 210 are electrically biased and heated up by power supply 452 as shown in FIG. 4C. Each frame is biased to heat up the workpiece or/and to maintain plasma. Power supply 452 can be DC, AC power supply and configured to heat up the workpieces without interfering plasma formed by power supply 451 by connecting frames 210 to power supply 452 through inductors such as coils.

The connections to each ring of frames can be switched on and off as an option externally, to enable different duration of plasma or heating time for each ring to control deposition uniformity. The process chamber can have insulating plates 435 mounted on the inner surface to prevent plasma formation between chamber and workpieces.

The above-described apparatus can operate and deposit films on large areas. The plasma properties are similar to parallel plate plasma with better uniformity and far fewer sharp edges that disturb plasma uniformity in the long sides of the workpieces. The top and bottom of the frames still form sharp edges and can be protected by insulators as an option. During operation, the workpieces 211 are mounted to the frames 212 and 213 and installed to the available outer rings 321 with groove. The electrical connections and gas connections from the rings with groove 321 are mounted on the bottom of the vacuum deposition chamber 436. The frames with workpieces are secured by connectors 323 on the top of frames 210 to either the rigid rings 322 attached to the side of the process chamber 431 or to neighboring frames. Human operator can stand in the center region of the vacuum deposition chamber 430, until all workpieces are mounted. The process chamber is then pumped down, the workpieces are heated up, and the precursor gases are flown in to enable CVD. RF or AC can be used to enable PECVD. For some processes such as nanowire formation steps used in silicon anode of lithium ion battery manufacturing, the CVD and PECVD are carried out sequentially, without touching the nanowire.

In the case of PECVD, only one side of the frames in the outermost and the innermost ring is coated. The outermost frames and workpieces and innermost frames and workpiece can be switched in the subsequent runs to coat the other side of the workpieces to ensure coating on both sides. If the frames are curved, the different curvature can be forced into the grooves or connectors on top of the frames. Frames with different curvatures can be another option to accommodate the different radius at different chamber positions.

Magnet fields can bend electrons in plasma, increase ionizations, increase plasma density, and decrease operating pressure. For example, magnetron sputtering operates at millitorr range, compared to hundreds of millitorr in parallel plate PECVD, and can apply high power into the plasma. When precursor gas such as silane ($SiH_4$) flows into the plasma, solid film films will be formed in such apparatus.

The higher rate of PECVD deposition will cover electrodes and other exposed surfaces; and prevent sputtering of deposition apparatus and reduce contaminations. A closed loop magnetic field can enable continuous electron confinement, lower operating pressure, and enhance plasma density. A lower operating pressure greatly reduces gas phase reactions and reduces powder formation.

Figure 5A:
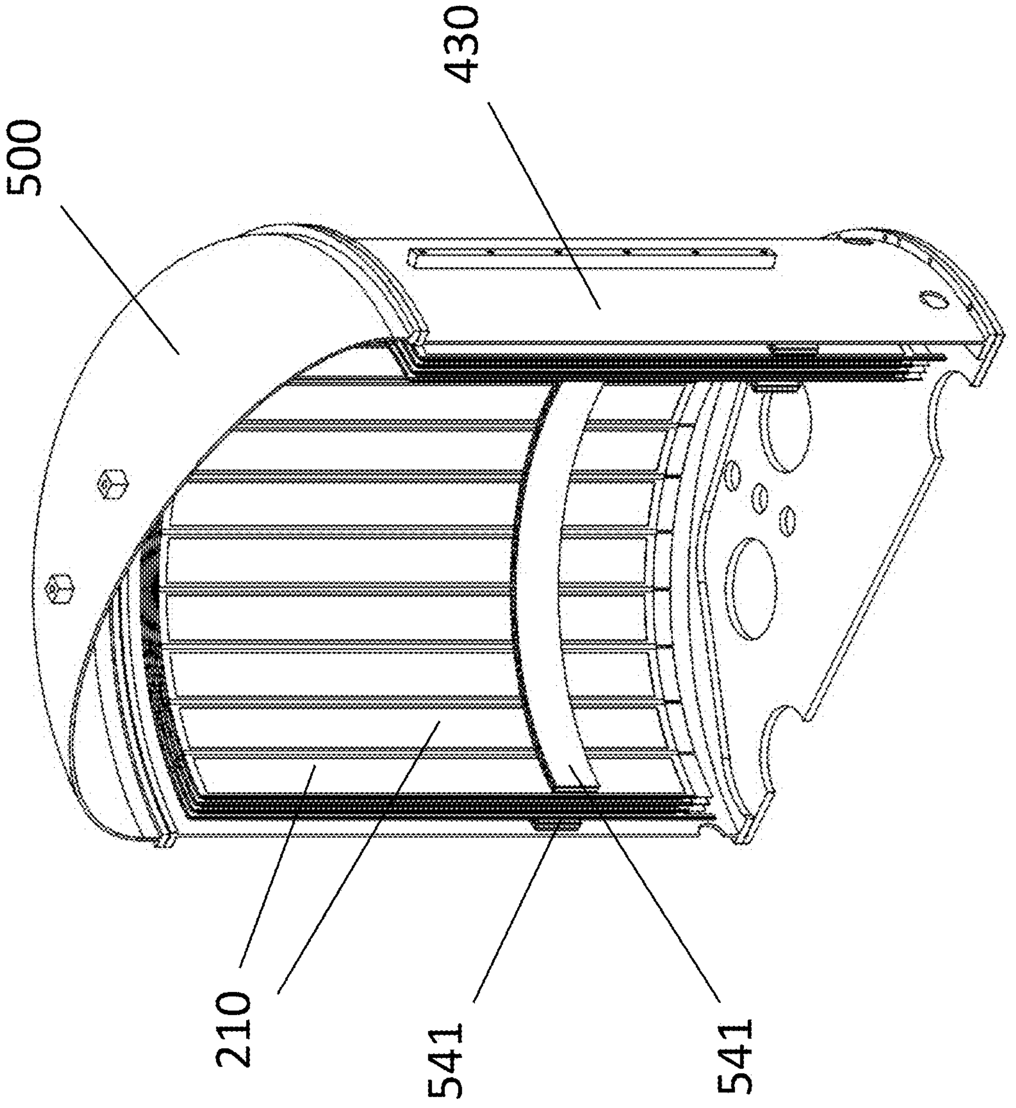
FIGS. 5A and 5B are respectively sectional perspective view and detailed view of a vacuum deposition system, showing individual workpiece assemblies forming multiple closed loops, and closed loop magnet rings to form magnetic field over workpieces inside a process chamber in accordance with the present invention.
Figure 5B:
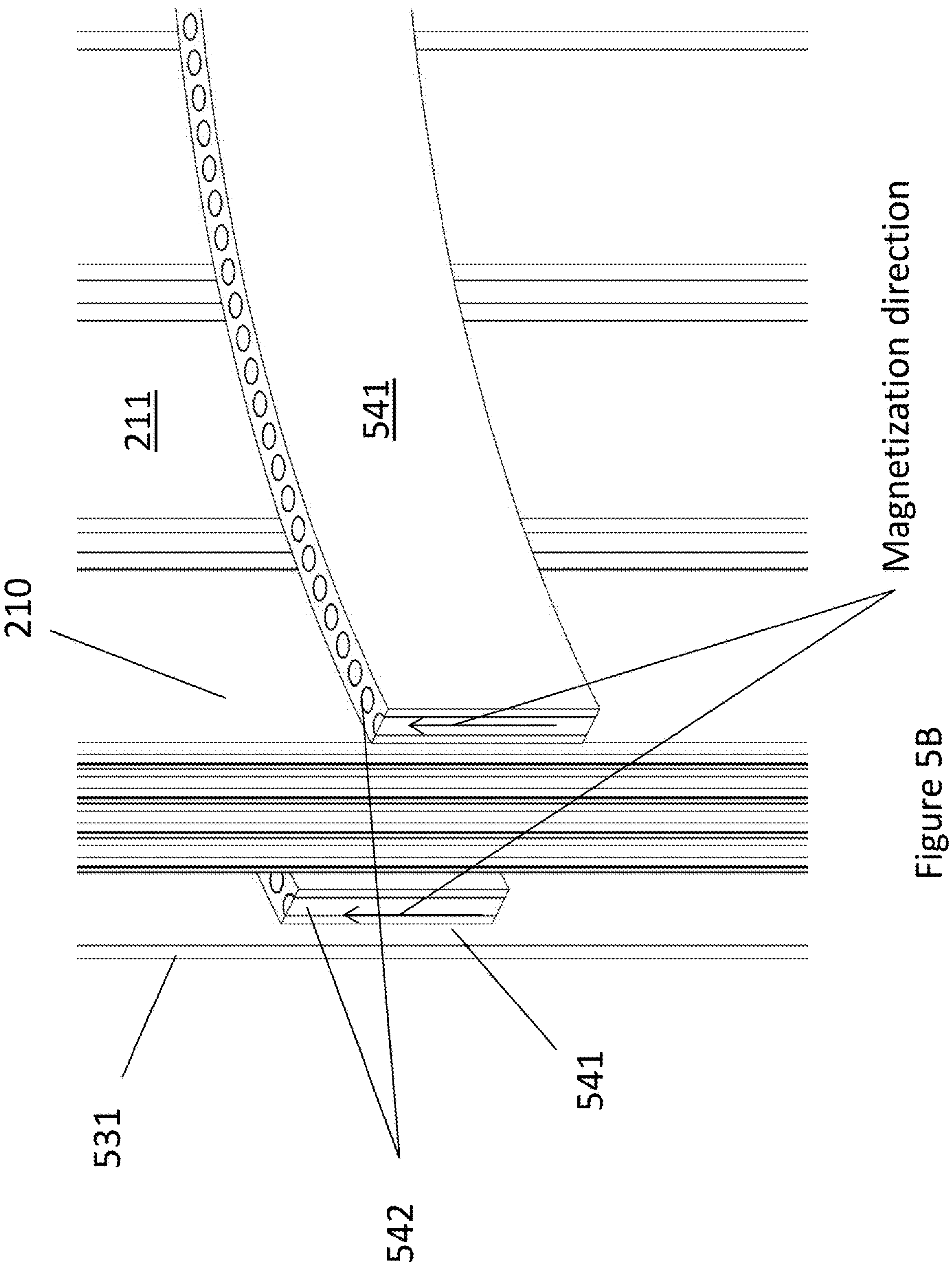

In some embodiments, referring to FIGS. 5A and 5B, a vacuum deposition system 500 includes multiple rings formed by frames 210 and workpieces with different radius in a vacuum chamber 430. Two closed loop magnet rings 541 form a closed loop magnetic field that has substantial magnetic fields parallel to surfaces of the workpiece. The magnets 542 are magnetized in the same direction, substantially parallel to the surface of workpiece 211. The electrons in the plasma will be trapped by this closed loop magnetic field and hop around the center axis of the deposition chamber and over surfaces of workpieces and frame 210, form closed loop movement of electrons, and increase ionization and reduce operating pressure. Even though one closed loop magnet ring 541 can produce a magnetic field that increases plasma ionization, two magnet rings 541 at similar height can improve the magnetic field uniformity in the process chamber radial direction. FIG. 5B shows the details of the magnet ring, where the magnets are magnetized along the center axis of the process chamber. The magnets can be same length or different length, similar distribution density or different distribution density to optimize the magnetic field uniformity or deposition uniformity on the work pieces. To prevent plasma formation between magnet rings and workpieces, the rings that hold the magnets are either insulators, or biased at same voltage as the frames and work pieces that are facing the magnet rings. The rings and the magnets can be optionally cooled and are scanned up and down to optimize deposition uniformity and stored away from the frames and work pieces when not needed, typically at the bottom of the process chamber.

Figure 6A:
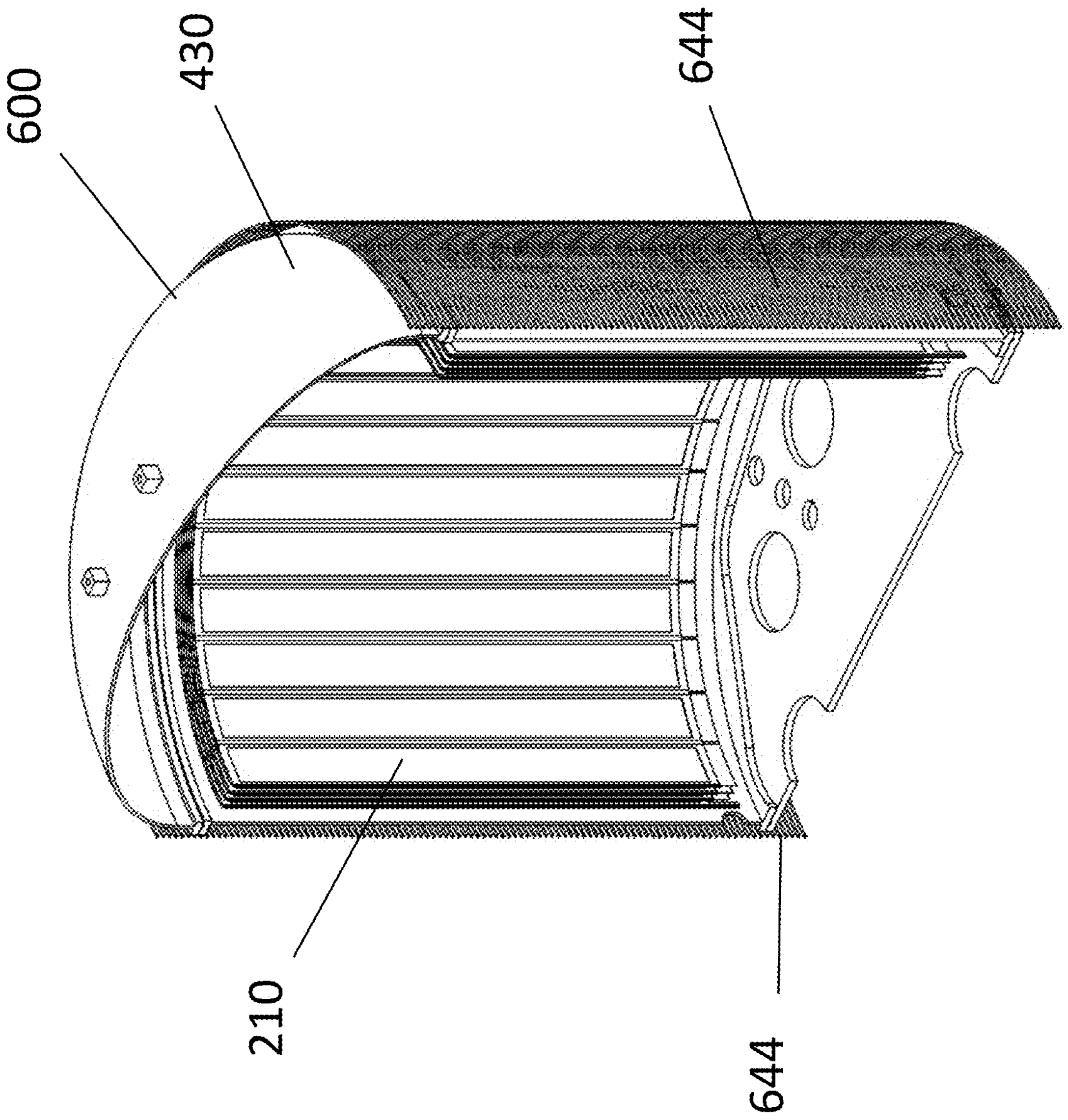
FIG. 6A is a sectional perspective view of a vacuum deposition system showing individual workpiece assemblies forming multiple closed loops, and electrical coil magnet outside a process chamber to form magnetic field over workpieces in accordance with the present invention.
Figure 6B:
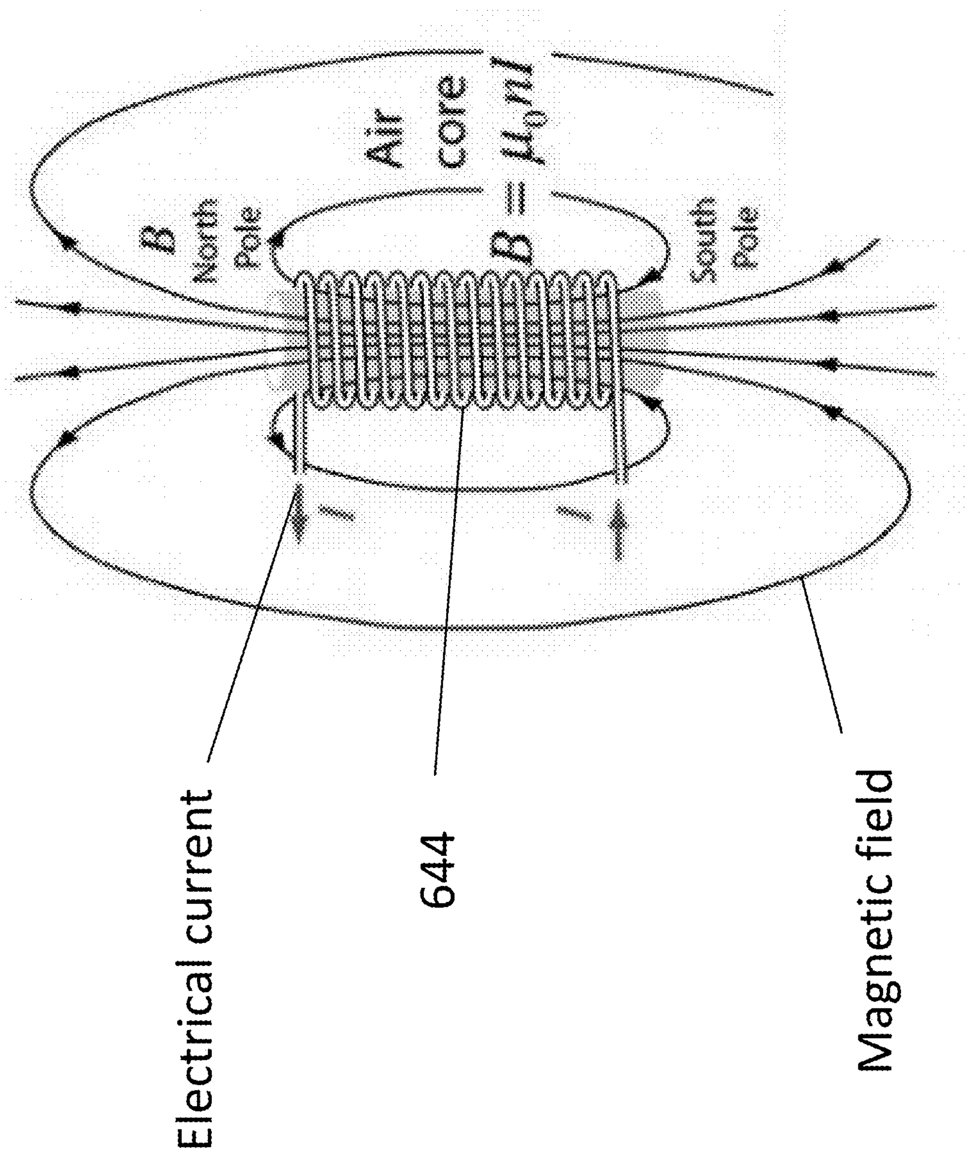
FIG. 6B illustrates the magnetic field formed by an electrical coil magnet in the vacuum deposition system in FIG. 6A.

In some embodiments, referring to FIG. 6A, a vacuum deposition system 600 includes multiple rings formed by frames 210 and workpieces with different radius in a vacuum chamber 430. The magnetic field can also be formed by electrical magnet or coils 644 outside the workpieces 210 and either outside or inside process chamber 430, where the coil 644 is outside the process chamber and longer than the work pieces to achieve acceptable deposition uniformity. The magnetic field can cover a larger area to enhance the plasma covering the entire workpieces, and lower the power density on work pieces. FIG. 6B illustrates the magnetic flux caused by the electrical current flow in a coil. The magnetic flux is more uniform if longer coil length compared to the diameter of the coil is used.

To counter the non-uniformity of electromagnet, the coil 644 can be non-uniform or extra coils to be placed near the ends of the main coil 644. The extra coil at the ends can increase the magnetic fields near the end inside the process chamber. Another way to improve deposition uniformity is to optimize the gas distribution, or use the permanent magnet ring similar to 541 of FIGS. 5A and 5B to selectively scan the ends of the work pieces during the deposition process to make up any low deposition rate regions.

To counter any potential non-uniformity between various work pieces at different radius, gas flow can be adjusted for each radius, the power can be varied at different radius, or the plasma on-time can be adjusted. For example, the electrical contact to each ring of work pieces can be independently turned on and off to apply power selectively for more or less film deposition.

The number of workpieces inside the process chamber can fill over 90% of space for a 10-feet diameter process chamber, assuming a 3-feet diameter empty space to allow the operator to mount and dis-mount workpieces. When the maximum and minimum radius difference is too large for the frames and workpieces to exchange, frames with different radius can be used. For many applications, such as electrode of battery, single sided anodes or cathodes may be needed at end of battery stack; the single side deposited workpieces can be used for these applications.

Figure 7A:
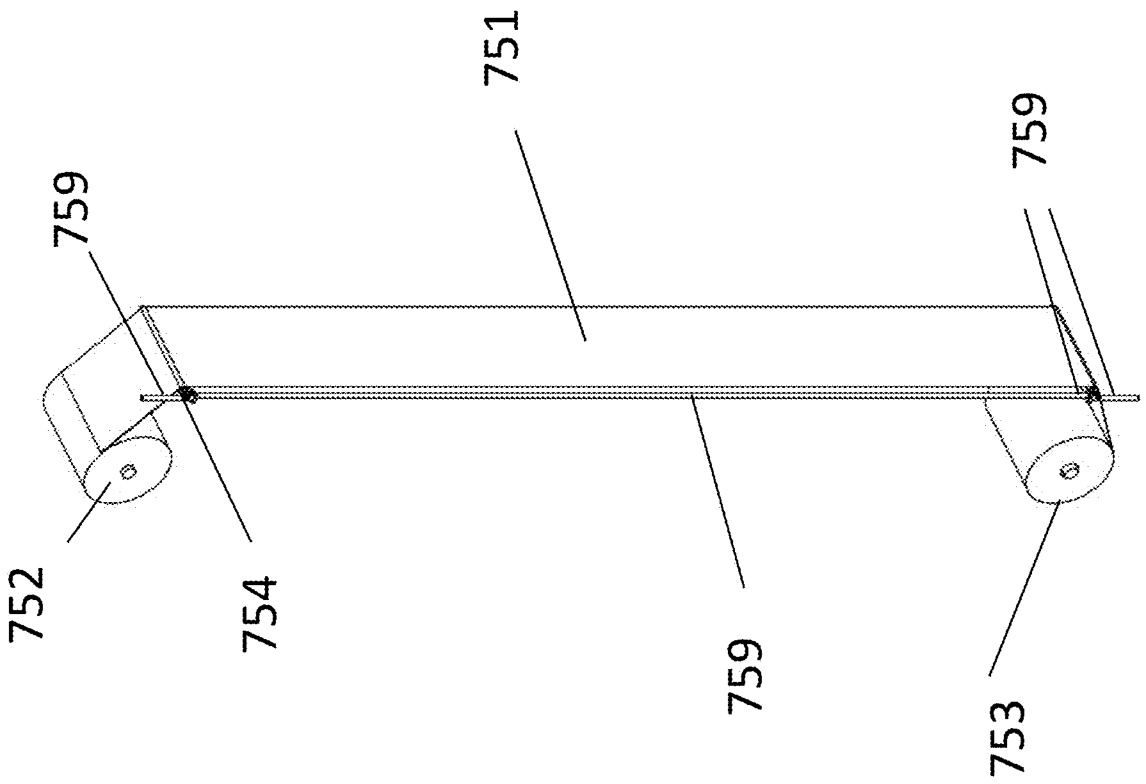
FIGS. 7A and 7B show an individual web with its handing apparatus and gas distribution, and the detail view, respectively, in a vacuum deposition system in accordance with the present invention.
Figure 7B:
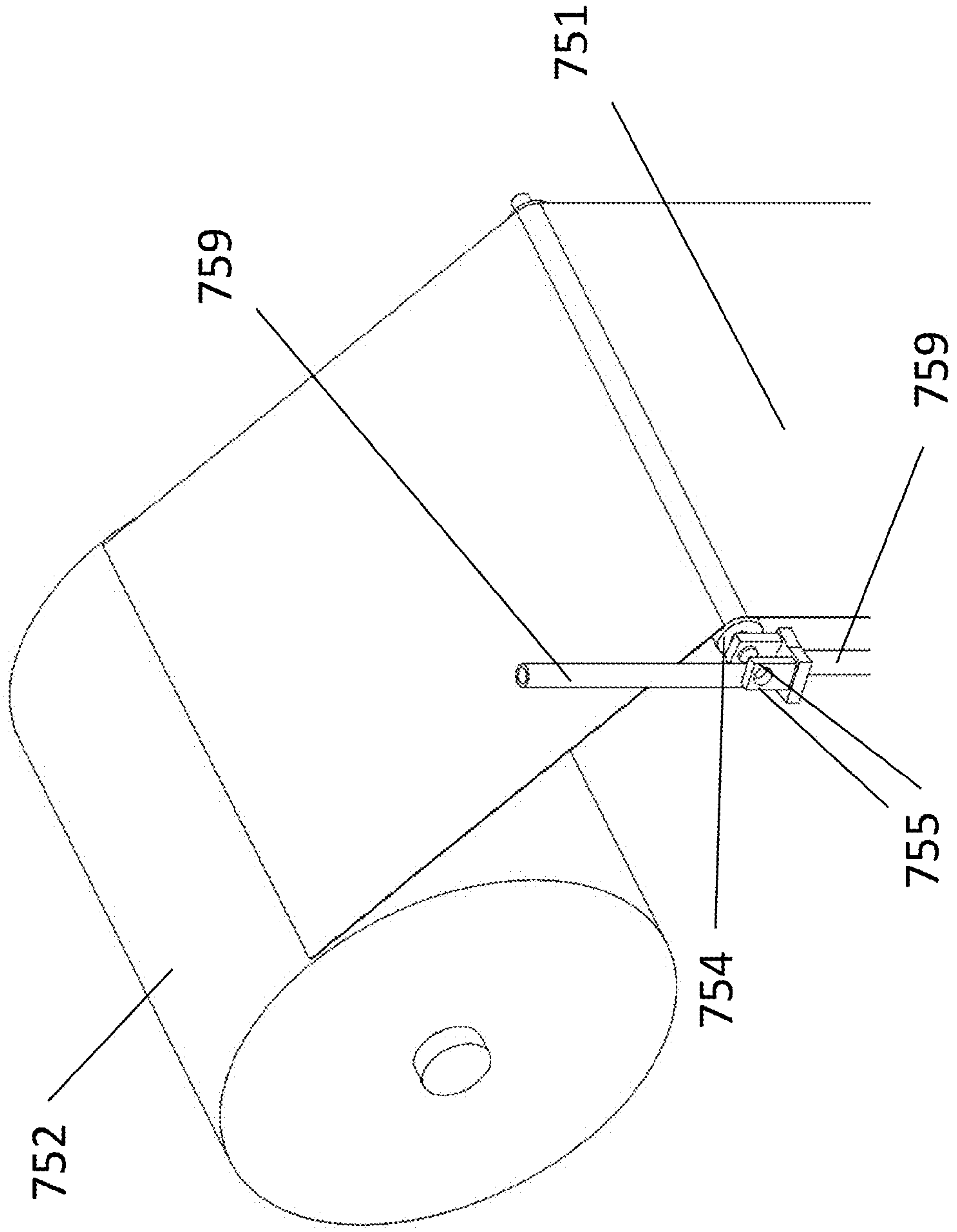

To have even higher productivity and loading capacity, the workpieces can be in the form of webs in a roll-to-roll configuration, and still maintain the parallel plate plasma in the process chamber. FIGS. 7A and 7B show this configuration where each workpiece 751 unwinds from the fresh roll 752; supported between two support rollers 754 that are either straight or curved to fit the curvature of the deposition location, and winded into the finished rewind roll 753. The two support rollers 754 can serve as the electrical connections for DC/AC heating or as electrodes connections for plasma formation. The web 751 can be fed continuously through the deposition chamber or fed a certain length at a time to process one section of workpiece at a time and then advance the work piece to the next section. For some applications such as very slow web moving speed, the two support rollers 754 can be just fixed rods, which can be straight or curved. The un-wind and re-wind rollers 752 and 753 can be motorized to control the feeding and tension in the web.

If different processes are needed to deposit multiple layers of film on the workpiece, such as nanowire formation in CVD and then Silicon coating using PECVD to manufacture silicon anodes of Lithium ion battery, the workpieces can be heated up in the presence of precursor gases to form nanowire; plasma is formed to deposit PECVD silicon; and the workpiece is advanced to the next section to repeat the process. The fresh contact between fresh workpiece 751 and support rollers 754 ensures good electrical contacts and consistent resistive heating of the workpiece 751 between support rollers 754. There can still be gas distribution channels or tubes 759 between workpieces to ensure deposition uniformity and to give extra space for mechanical handling 755 of workpiece webs. There can be conductive plates attached to the gas distribution channels 759 to fill the gaps between neighboring workpieces and to ensure continuity of plasma. The gas distribution channels 759 and the conductive plate (not shown) can serve as mechanical support for 755 and for the support rollers 754.

Figure 7C:
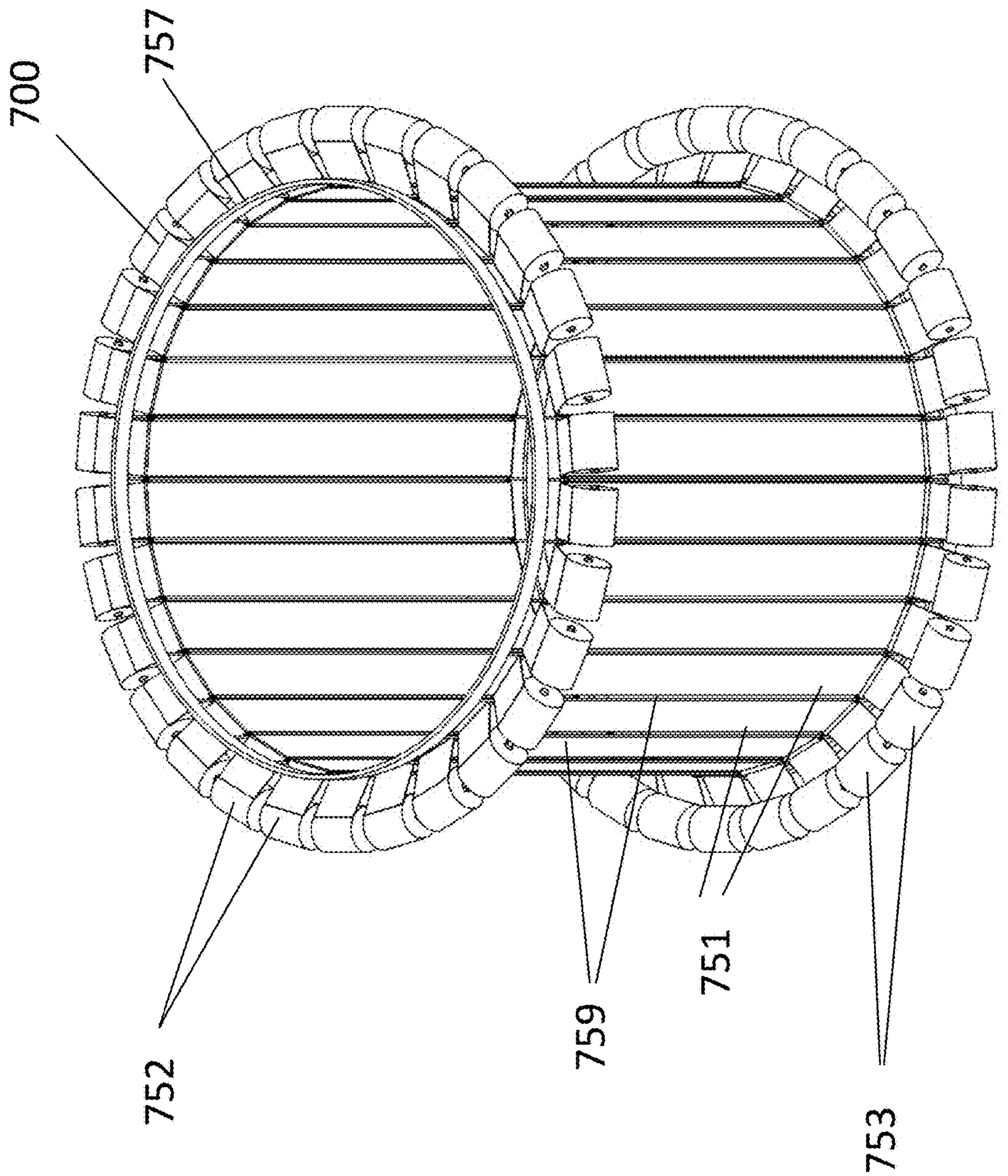
FIGS. 7C and 7D show multiple individual webs with their handing apparatus and gas distribution from the vacuum deposition system of FIG. 7A forming a ring, and the sectional perspective view, respectively, in accordance with the present invention.
Figure 7D:
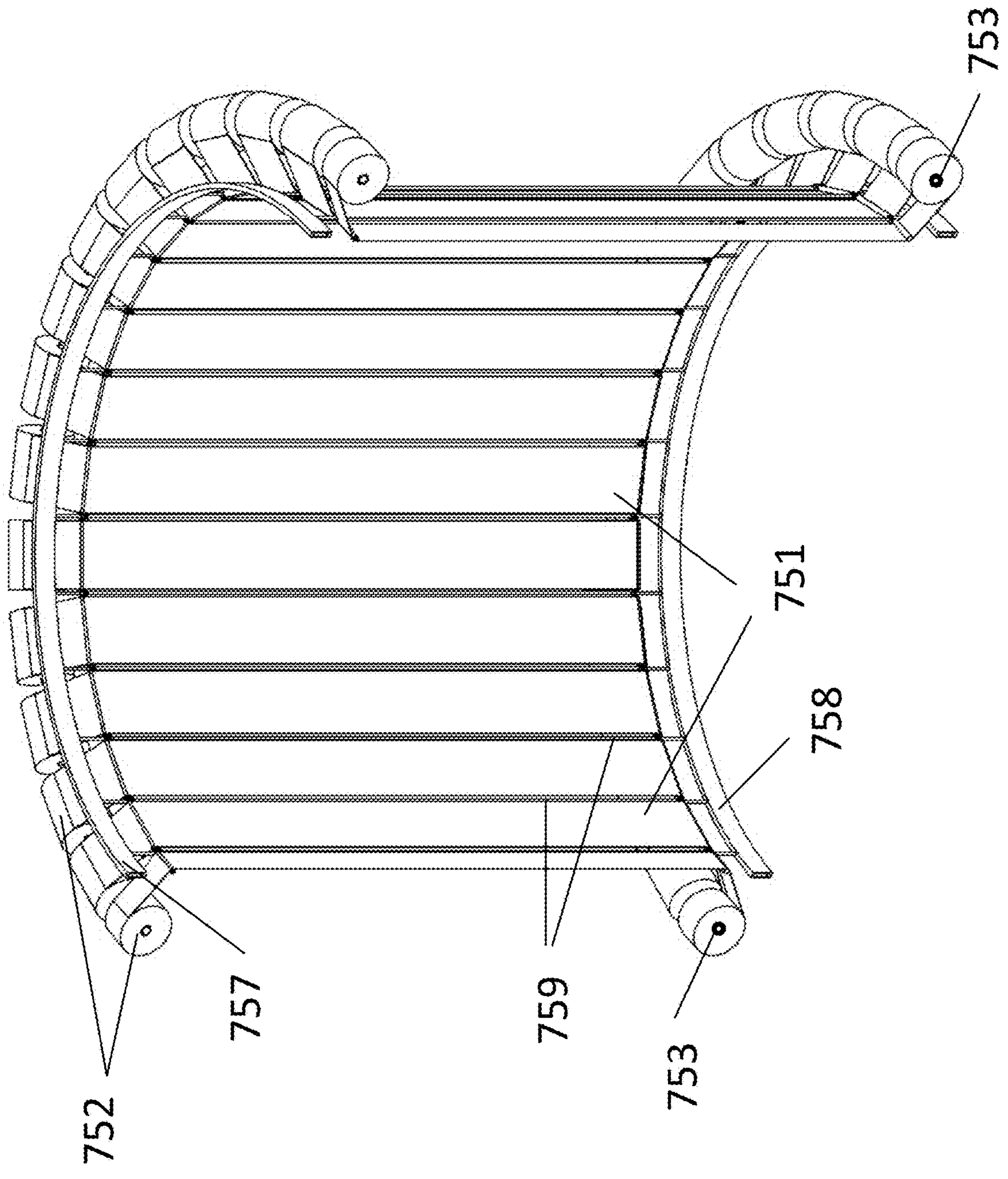
Figure 7E:
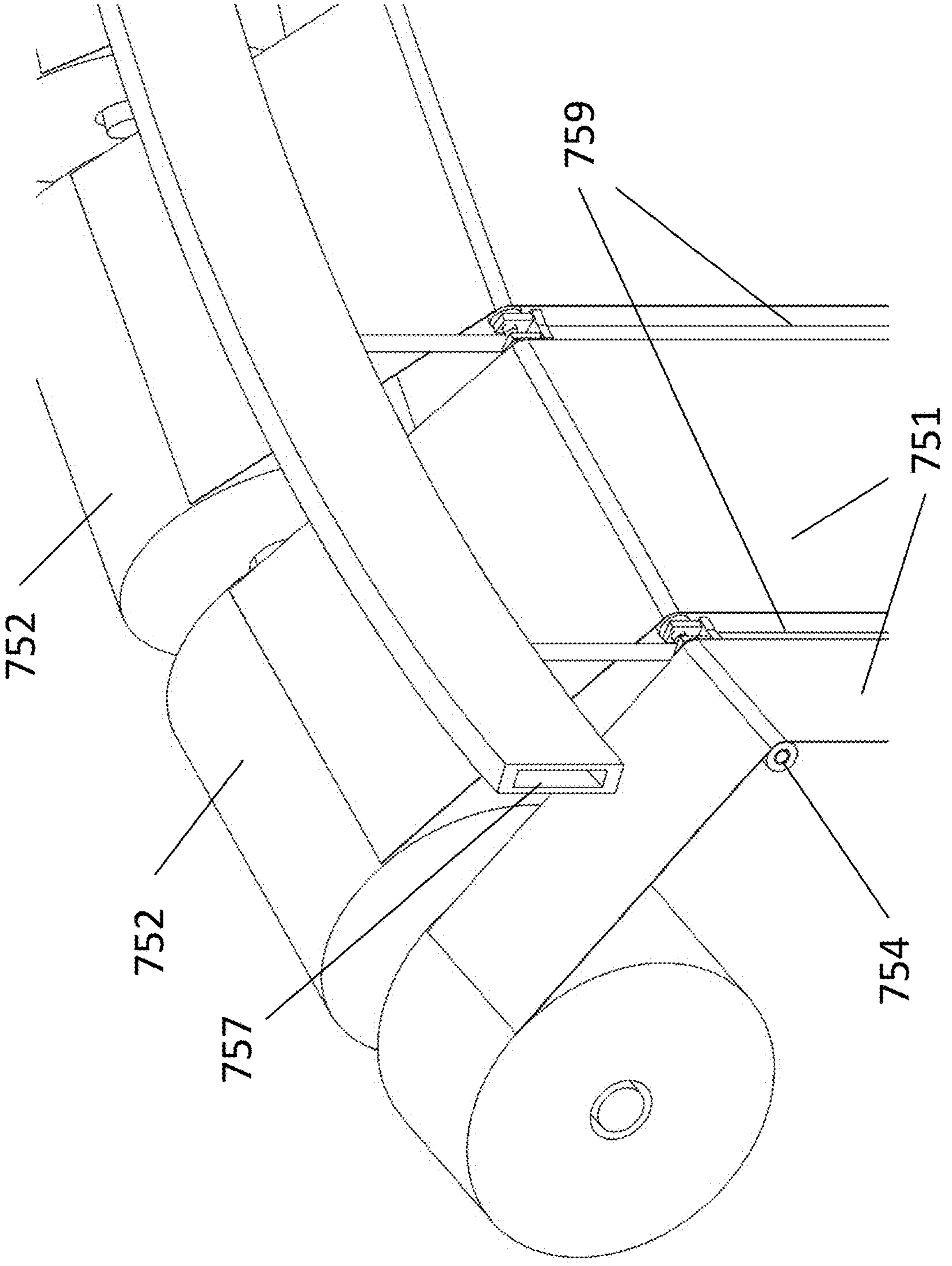
FIGS. 7E and 7F show detailed views of upper part of FIG. 7D, and with optional cover plates over the gaps between individual webs, respectively, in accordance with the present invention.
Figure 7F:
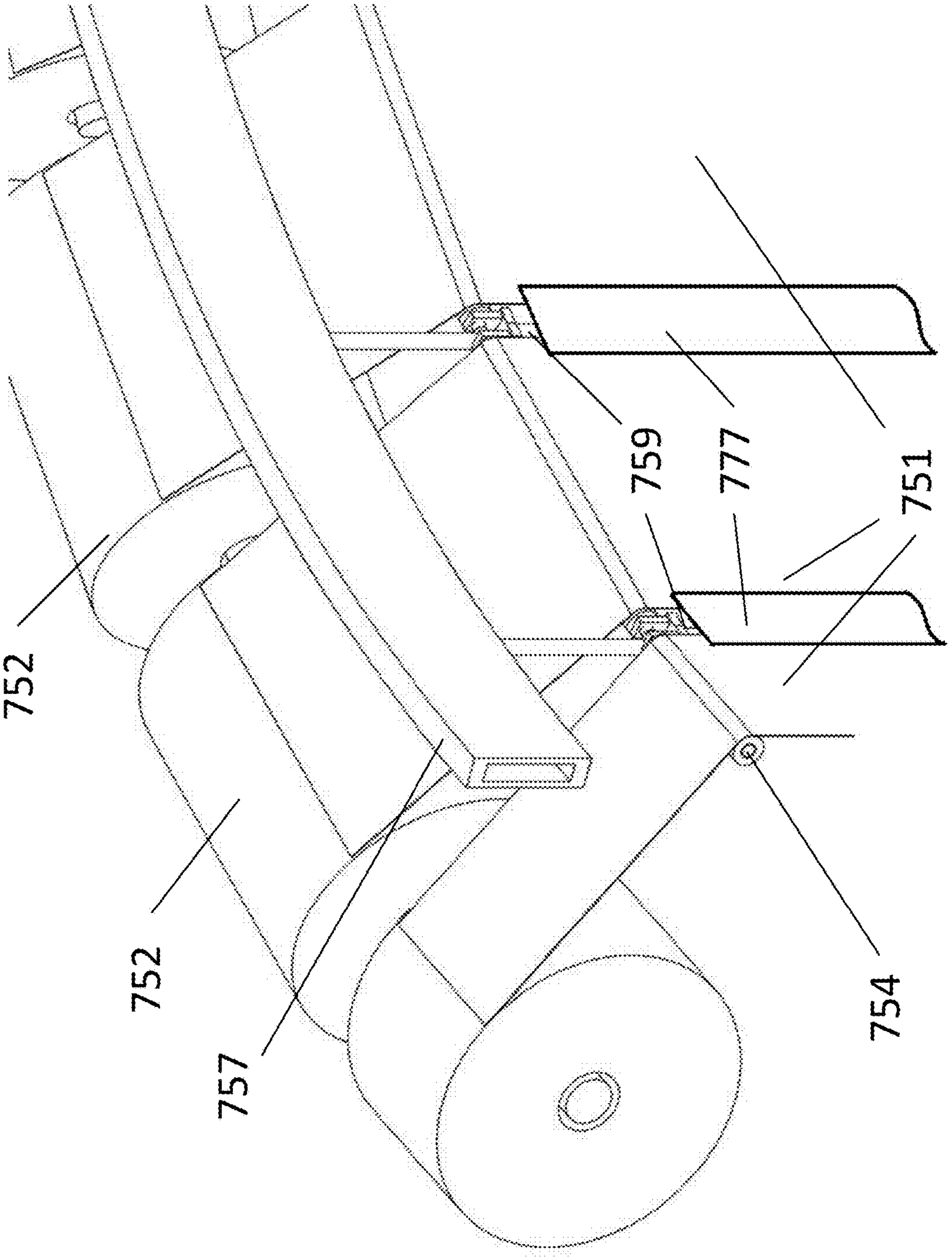

In some embodiments, referring to FIGS. 7C-7E, a vacuum deposition system 700 includes a plurality of individual webs 751 from FIGS. 7A and 7B, and the individual webs 751 are mounted to form a ring inside a vacuum chamber (not shown) similar to the vacuum chamber 430 of FIG. 4A. The individual gas distribution channels rings 757 and 758 are inserted to top and bottom as gas distribution for precursor gases. The top and bottom support rings 757 and 758 can be mounted to the process chamber 430 through insulators and connected to various power supplies similar to FIGS. 4B and 4C. The mechanical mounting and drives for the un-wind 752 and re-wind rolls 753 can be implemented in many ways, since there will be space for these mounting and drives hardwires, as rolls 752 and 753 are outside the radius of web 751. The support rollers 754 are passive devices or just rods, it is possible to have a small gap between webs to accommodate the bearings, fixtures, and mounting of the support rollers. Conductive plates 777 can be mounted between neighboring webs to ensure plasma continuity. For applications such as making anodes of batteries, keeping edge free of films for electrical contact is important for battery operation. The conductive plates 777 between web can serve this propose.

Figure 8A:
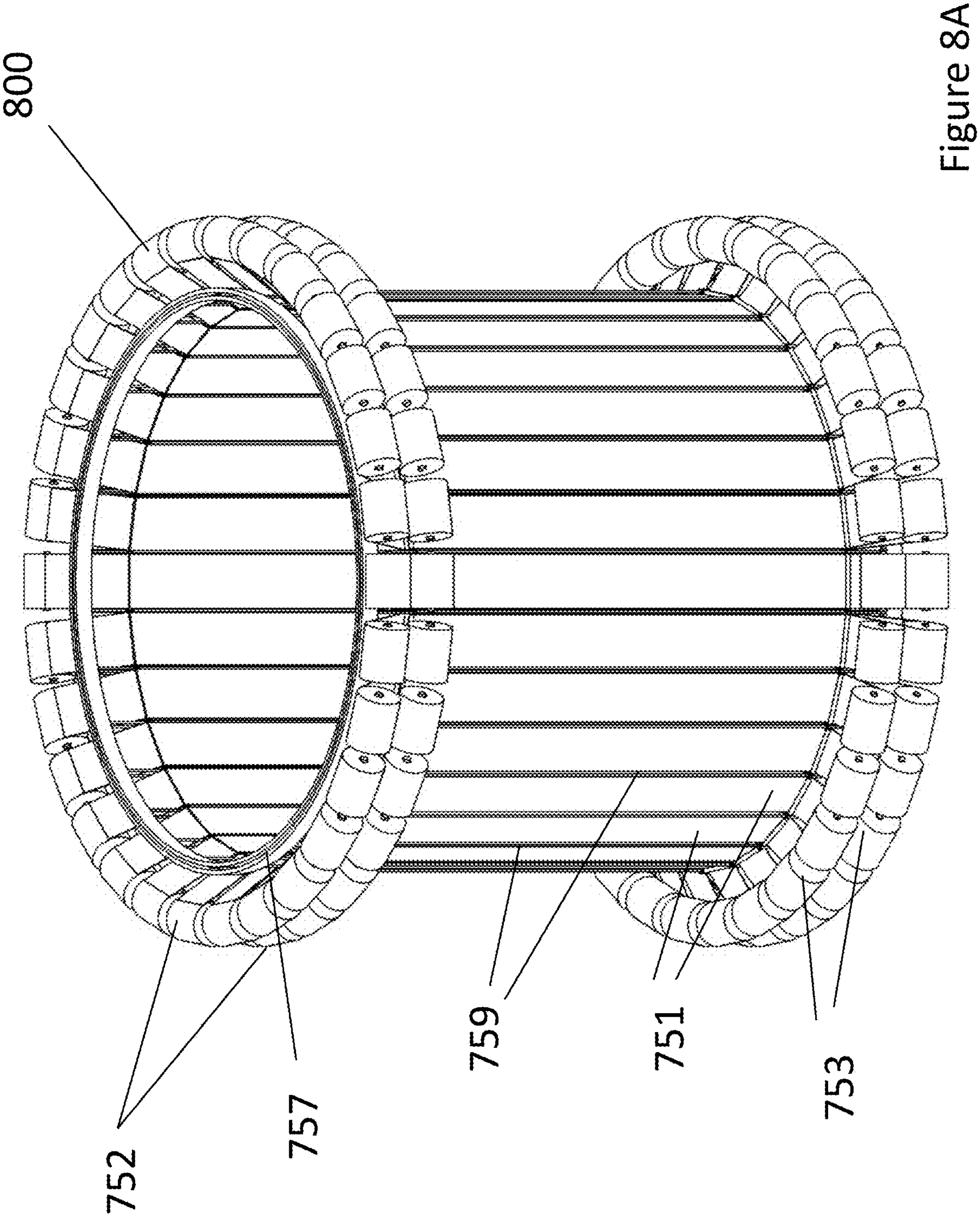
FIGS. 8A and 8B show multiple webs from the vacuum deposition system of FIG. 7C forming multiple rings, and the sectional perspective view, respectively, in accordance with the present invention.
Figure 8B:
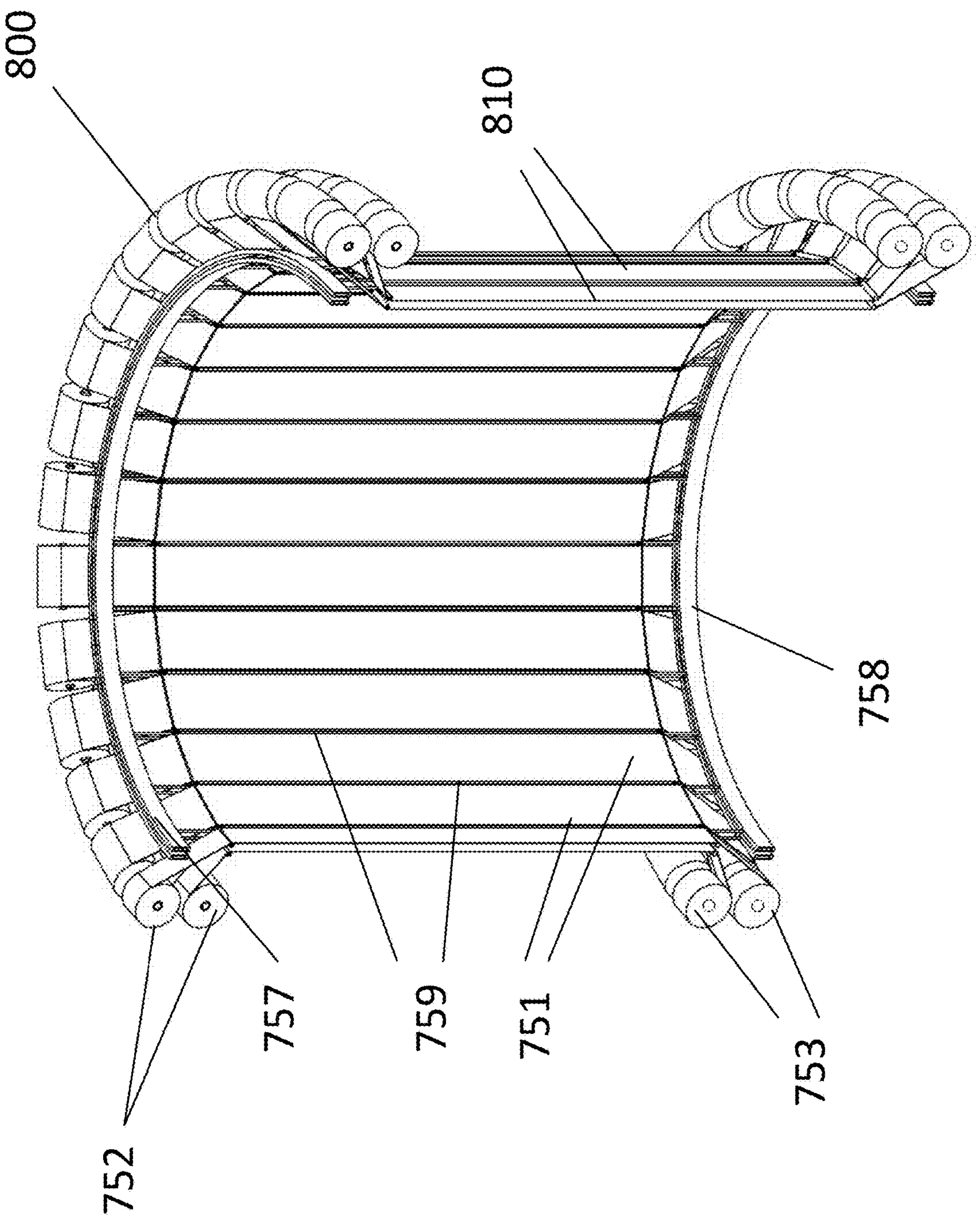
Figure 8C:
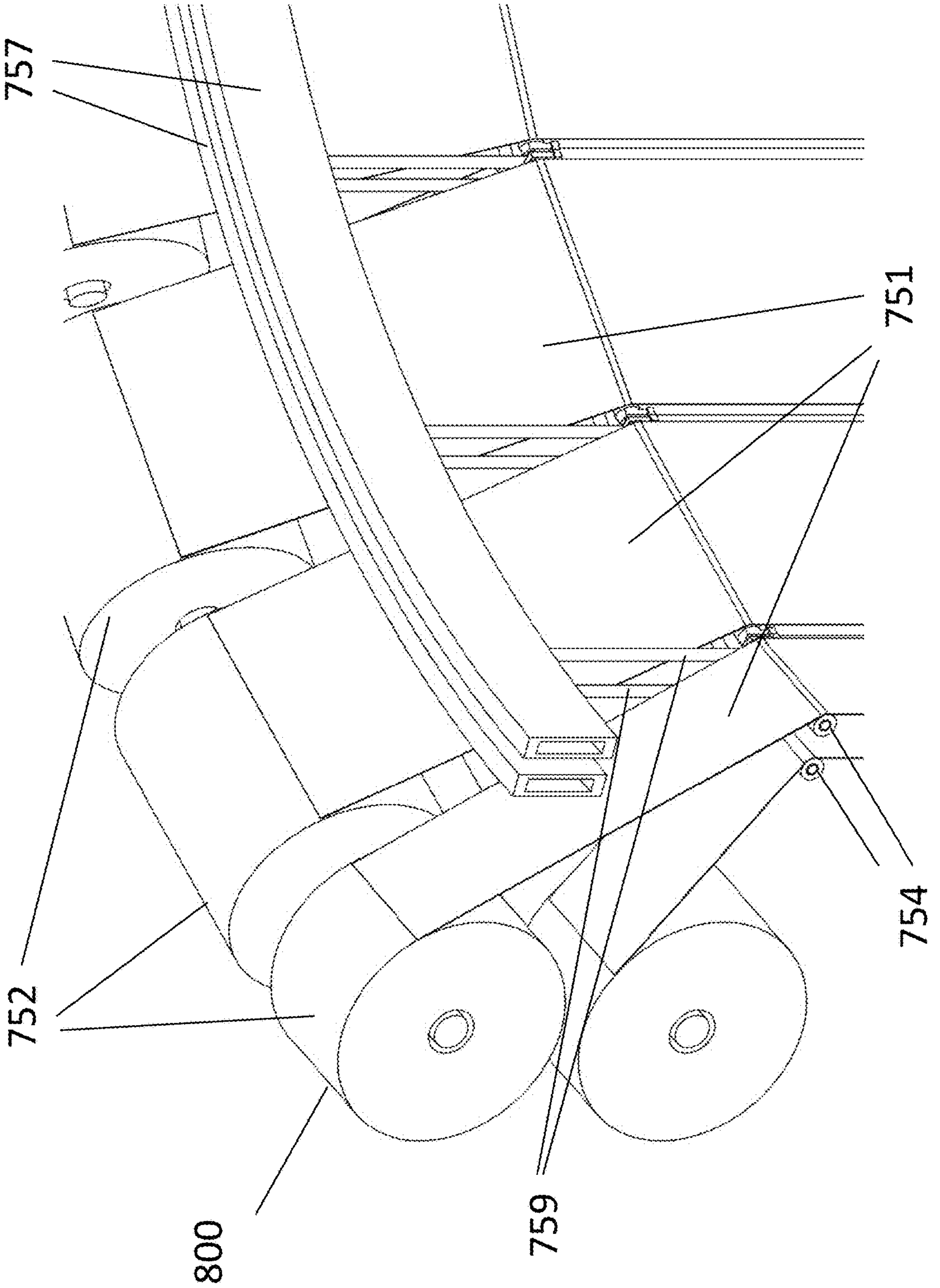
FIGS. 8C and 8D show detailed views of the upper portion of the vacuum deposition system of FIG. 8B, and a cross-sectional view of FIG. 8C, respectively, in accordance with the present invention.
Figure 8D:
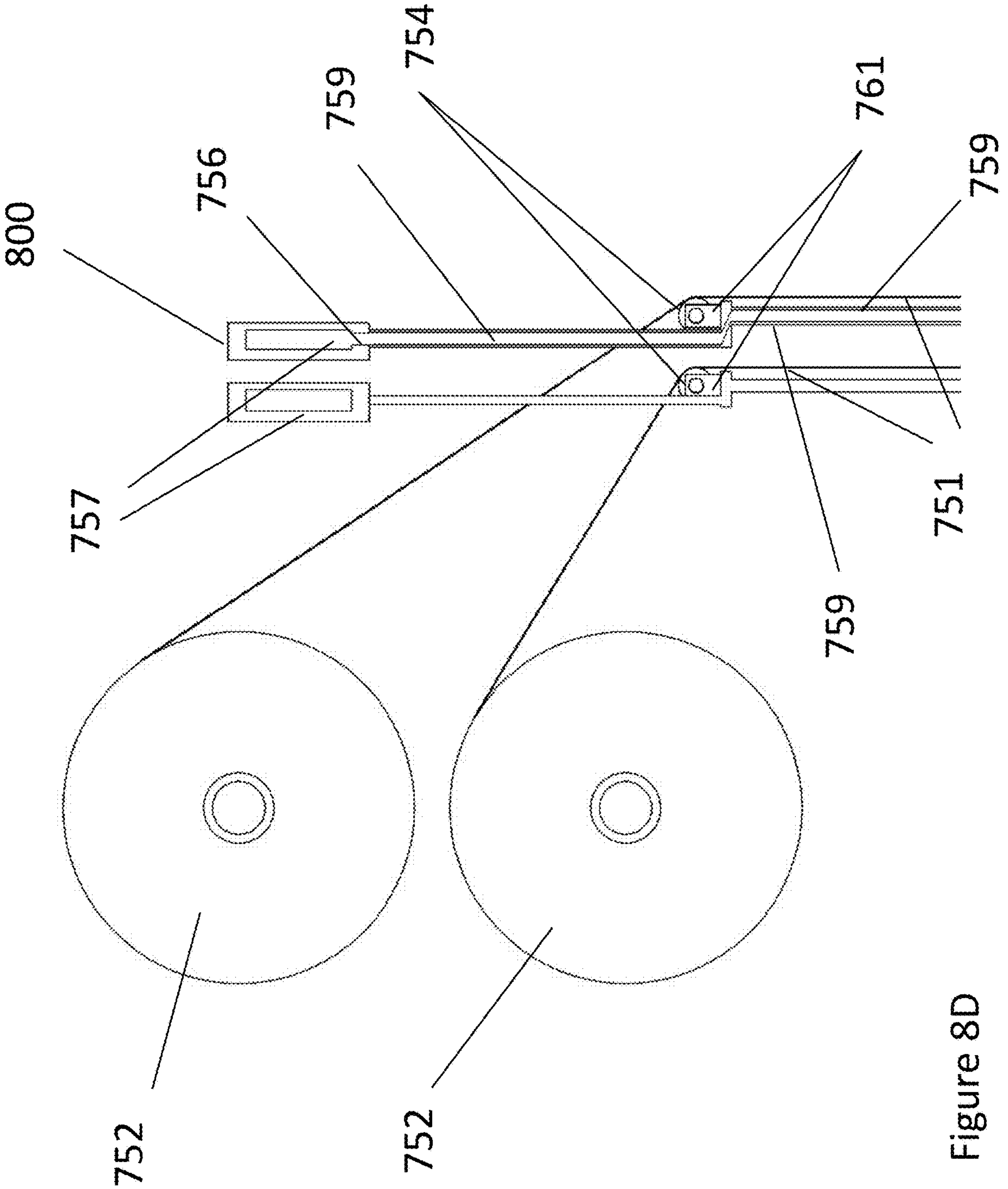

In some embodiments, referring to FIGS. 8A and 8B, multiple rings formed by individual webs 810 with different radius can be mounted inside the process chamber (not shown) similar to the vacuum chamber 430 in FIG. 4A are placed inside a vacuum deposition system 800. It is important to avoid interference both mechanically and electrically, and to avoid plasma formation outside the process zone. FIGS. 8C and 8D illustrate the details at the top of the vacuum deposition system 800. The vertical gas channels 759 are connected to top and bottom support rings 757 and 758, respectively, through roller mounting plates 761, where the support rollers 754 are mounted, to form a rigid structure. There are optional gas distribution channels inside 757 and 758. The precursor gases flow from the support ring 757 and 758, through the roller mounting plate 761, and into the gas distribution channel 759. 756 is an opening from support ring 757 to gas channel 759. The gas distribution channels have optimized holes distribution to achieve deposition uniformity. Plasma is formed between webs in each ring to its neighboring rings, with or without the assistance of magnetic fields in FIGS. 5 and 6.

The invention claimed is:

1. A plasma deposition apparatus, comprising:
a vacuum chamber;
a first workpiece assembly, comprising:
a first frame configured to hold a plurality of workpieces; and
first gas channels formed in between the workpieces and the frames, wherein the first gas channels are configured to transport a gas from a gas source to the plurality of workpieces to produce material deposition on the workpieces,
wherein the first workpiece assembly forms a first cylinder in the vacuum chamber, and
a plurality of workpiece assemblies including the first workpiece assembly, wherein the plurality of workpiece assemblies forms concentric cylinders in the vacuum chamber.

2. The plasma deposition apparatus of claim 1, wherein each of the plurality of workpiece assemblies includes
a frame configured to hold a plurality of workpieces;
gas channels formed in between the workpieces and the frames, wherein the gas channels are configured to transport a gas from a gas source to the plurality of workpieces,
wherein the workpiece assembly forms one of the concentric cylinders in the vacuum chamber.

3. The plasma deposition apparatus of claim 2, further comprising:
a power supply configured to produce an electric potential between adjacent workpiece assemblies in the concentric cylinders.

4. The plasma deposition apparatus of claim 1, further comprising:
a magnetic ring disposed adjacent to the first workpiece assembly, wherein the magnetic ring is configured to produce a magnetic field that increases plasma ionization of the gas.

5. The plasma deposition apparatus of claim 1, wherein the first frame includes gas distribution plates configured to hold a plurality of workpieces, wherein the gas distribution plates are configured to define, in part, the gas channels, wherein the gas distribution plates include distribution holes configured to release the gas to vicinity of the workpieces.

6. The plasma deposition apparatus of claim 1, further comprising:
a magnet ring disposed adjacent to the first workpiece assembly and configured to produce a magnetic field next to surfaces of the workpieces to improve formation of the material deposition on the workpieces.

7. The plasma deposition apparatus of claim 6, wherein the magnet ring is formed by electrical magnets.

8. The plasma deposition apparatus of claim 6, wherein the magnet ring is formed by electrical coils.

9. The plasma deposition apparatus of claim 6, wherein the magnet ring is configured to be moved along an axial direction of the first cylinder to improve uniformity of the plasma and the material deposition.

10. The plasma deposition apparatus of claim 1, further comprising:
electric heaters configured to heat the workpieces.

11. The plasma deposition apparatus of claim 1, wherein the first workpiece assembly comprises a bottom portion and weights mounted to the bottom portion, wherein the weights are configured to produce tension in the first workpiece assembly.

12. The plasma deposition apparatus of claim 1, wherein the first workpiece assembly comprises a bottom portion and springs mounted to the bottom portion, wherein the springs are configured to produce tension in the first workpiece assembly.

13. A plasma deposition apparatus, comprising:
a vacuum chamber; and
a plurality of workpiece assemblies that form concentric cylinders in the vacuum chamber,
wherein each of the plurality of workpiece assemblies includes a frame configured to hold a plurality of workpieces,
wherein the plurality of workpieces is configured to receive material deposition.

14. The plasma deposition apparatus of claim 13, further comprising:
electric connections configured to heat the workpieces.

15. The plasma deposition apparatus of claim 13, wherein the plurality of workpiece assemblies further comprises:
gas channels formed in between the workpieces and the frames in the plurality of workpiece assemblies, wherein the gas channels are configured to transport a gas from a gas source to the plurality of workpieces to produce material deposition.

16. The plasma deposition apparatus of claim 15, further comprising:
a magnetic ring disposed adjacent to the plurality of workpiece assemblies, wherein the magnetic ring is configured to produce a magnetic field that increases plasma ionization of the gas.

17. The plasma deposition apparatus of claim 13, further comprising:
a power supply configured to produce an electric potential between adjacent workpiece assemblies in the concentric cylinders.

18. A plasma deposition apparatus, comprising:
a vacuum chamber;
a plurality of webs that form a cylinder in the vacuum chamber, wherein the plurality of webs is positioned parallel to an axis of the cylinder; and
transport mechanisms configured to move each of the plurality of webs along a direction parallel to the axis of the cylinder, such that different portions of the plurality of webs are configured to receive material deposition.

19. The plasma deposition apparatus of claim 18, further comprising:

electric heaters configured to heat the plurality of webs.

20. The plasma deposition apparatus of claim 18, further comprising:

gas channels configured to transport a gas from a gas source to form a continuous plasma on surfaces of the cylinder formed by the plurality of webs, thereby producing material deposition on the plurality of webs.

* * * * *